(12) United States Patent
Hirose et al.

(10) Patent No.: US 12,342,520 B2
(45) Date of Patent: *Jun. 24, 2025

(54) SEMICONDUCTOR STORAGE DEVICE

(71) Applicant: Socionext Inc., Kanagawa (JP)

(72) Inventors: Masanobu Hirose, Yokohama (JP); Yasunori Murase, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/749,271

(22) Filed: Jun. 20, 2024

(65) Prior Publication Data

US 2024/0341074 A1    Oct. 10, 2024

Related U.S. Application Data

(63) Continuation of application No. 17/879,415, filed on Aug. 2, 2022, now Pat. No. 12,048,134, which is a
(Continued)

(30) Foreign Application Priority Data

Feb. 19, 2020 (JP) .................................. 2020-026503

(51) Int. Cl.
*G11C 11/00*    (2006.01)
*G11C 11/412*   (2006.01)
(Continued)

(52) U.S. Cl.
CPC ............ *H10B 10/12* (2023.02); *G11C 11/412* (2013.01); *G11C 11/419* (2013.01); *H10B 10/18* (2023.02)

(58) Field of Classification Search
CPC . G11C 11/4094; G11C 11/4099; G11C 11/41; G11C 2029/0403; G11C 5/147;
(Continued)

(56) References Cited

U.S. PATENT DOCUMENTS 11,107,822 B2    8/2021 Yang et al.
12,048,134 B2 *  7/2024 Hirose .................. H01L 21/768
(Continued)

FOREIGN PATENT DOCUMENTS

JP    2001-028401 A    1/2001
JP    2013-026594 A    2/2013
WO    2016/117288 A1   7/2016

OTHER PUBLICATIONS

International Search Report (ISR) dated May 11, 2021 issued in International Patent Application No. PCT/JP2021/003869 with English translation.
(Continued)

*Primary Examiner* — Thong Q Le
(74) *Attorney, Agent, or Firm* — Rimon P.C.

(57) ABSTRACT

Nanosheets 21 to 23 are formed in line in this order in the X direction, and nanosheets 24 to 26 are formed in line in this order in the X direction. In a buried interconnect layer, a power line 11 is formed between the nanosheets 22 and 25 as viewed in plan. A face of the nanosheet 22 on a first side as one of the sides in the X direction is exposed from a gate interconnect 32. A face of the nanosheet 25 on a second side as the other side in the X direction is exposed from a gate interconnect 35.

6 Claims, 14 Drawing Sheets

Related U.S. Application Data continuation of application No. PCT/JP2021/003869, filed on Feb. 3, 2021.

(51) Int. Cl.
  *G11C 11/419* (2006.01)
  *H10B 10/00* (2023.01)

(58) Field of Classification Search
  CPC ............ G11C 11/1657; G11C 11/2257; G11C 16/0483; G11C 16/107; G11C 2029/5006; G11C 2213/71; G11C 29/50; G11C 7/08; G11C 7/106; G11C 7/1087; G11C 11/4125; G11C 7/062; G11C 7/24; H10B 10/12; H10B 10/125; H10B 10/00; H10B 43/27; H10B 43/40; H10B 43/10; H10B 43/50; H10B 10/18; H10B 12/03; H10B 12/05; H10B 12/30; H10B 12/482; H10B 43/35; H10B 41/27; H10B 41/35; H10B 41/41; H10B 41/50; H10B 12/50; H10B 20/00; H10B 41/00; H10B 41/10; H10B 41/40; H10B 61/22; H10B 63/845; H10B 69/00; H10B 99/00; H10D 89/10; H10D 84/01; H10D 30/43; H10D 30/67; H10D 62/121; H10D 64/20; H10D 64/27; H10D 64/66; H10D 84/0165; H10D 84/038; H10D 84/85; H10D 30/6735; H10D 30/6757; H10D 62/118; H10D 64/23; H10D 84/0126; H10D 84/83; H01L 21/3205; H01L 21/768; H01L 23/522; H01L 21/76895; H01L 23/50; H01L 23/5283; H01L 23/5286; H01L 23/535

See application file for complete search history.

(56) References Cited

U.S. PATENT DOCUMENTS

| | | |
|---|---|---|
| 2002/0117722 A1 | 8/2002 | Osada et al. |
| 2013/0026580 A1 | 1/2013 | Morimoto et al. |
| 2017/0162583 A1 | 6/2017 | Lee et al. |
| 2017/0317065 A1 | 11/2017 | Hirose |

OTHER PUBLICATIONS

P. Weckx et al., "Stacked nanosheet fork architecture for SRAM design and device co-optimization toward 3nm", 2017 IEEE International Electron Devices Meeting (IEDM), Dec. 2017, IEDM17-505~508.

P. Weckx et al., "Novel forksheet device architecture as ultimate logic scaling device towards 2nm", 2019 IEEE International Electron Devices Meeting (IEDM), Dec. 2019, IEDM19-871~874.

Notice of Allowance dated Mar. 25, 2024 issued in U.S. Appl. No. 17/879,415.

* cited by examiner

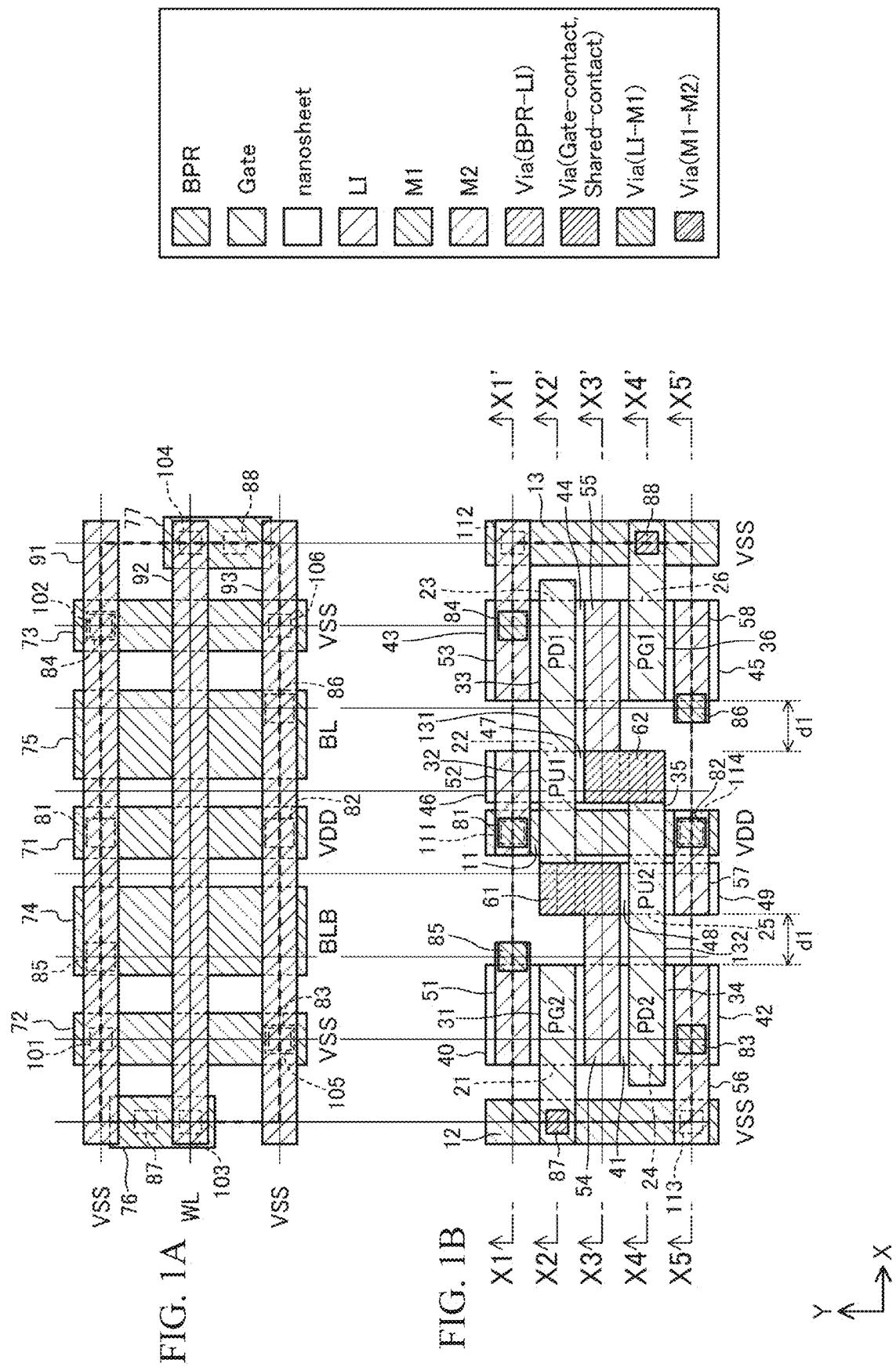

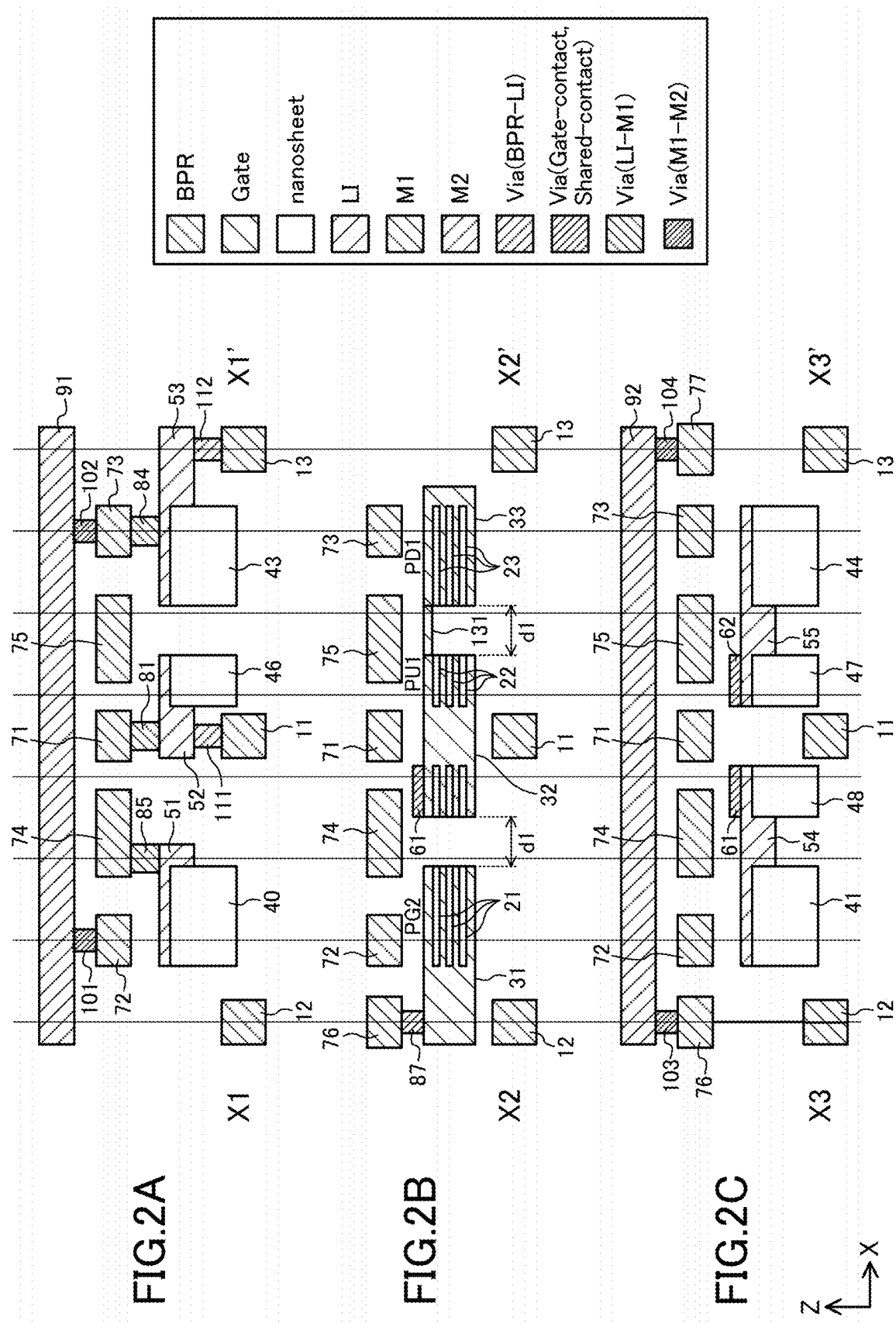

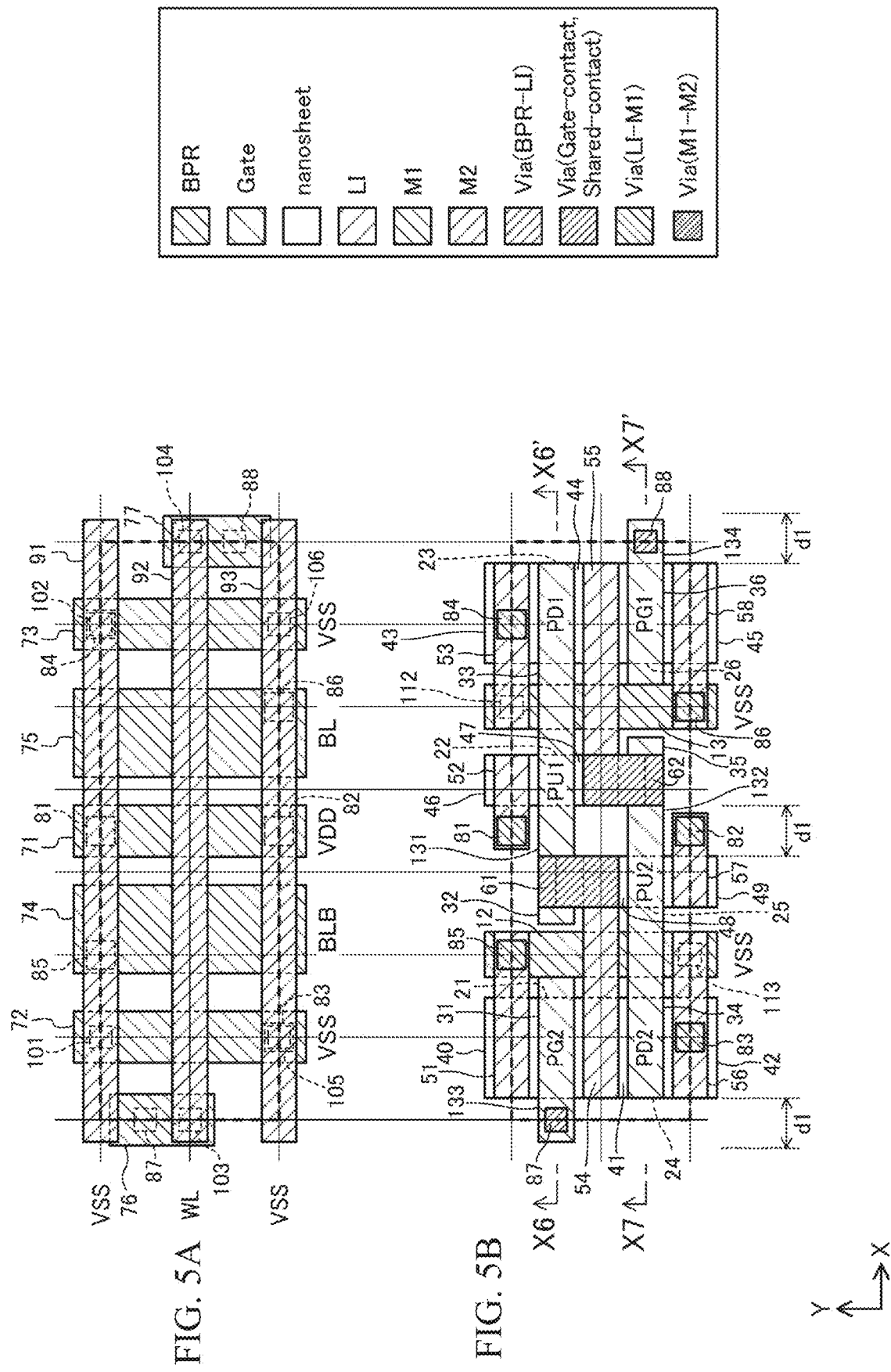

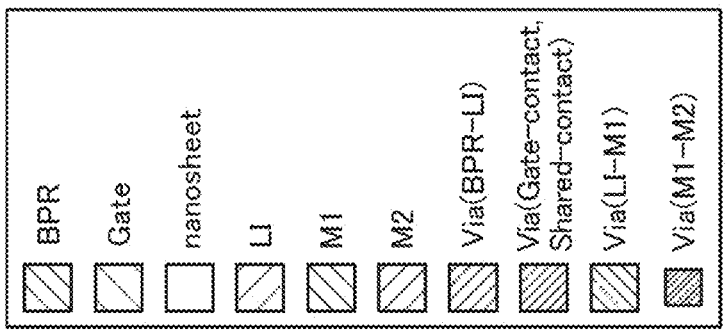
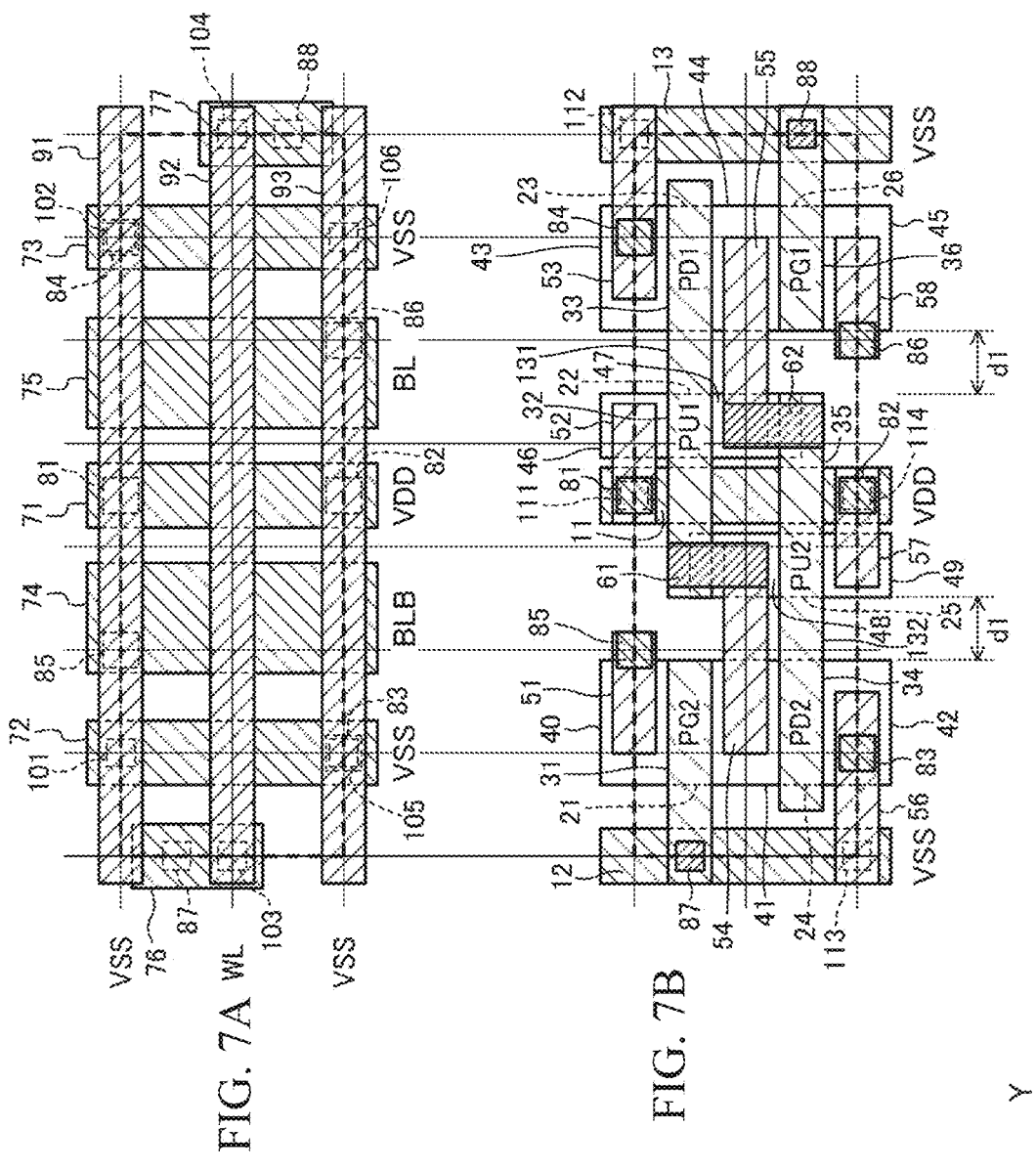
FIG. 7A
FIG. 7B

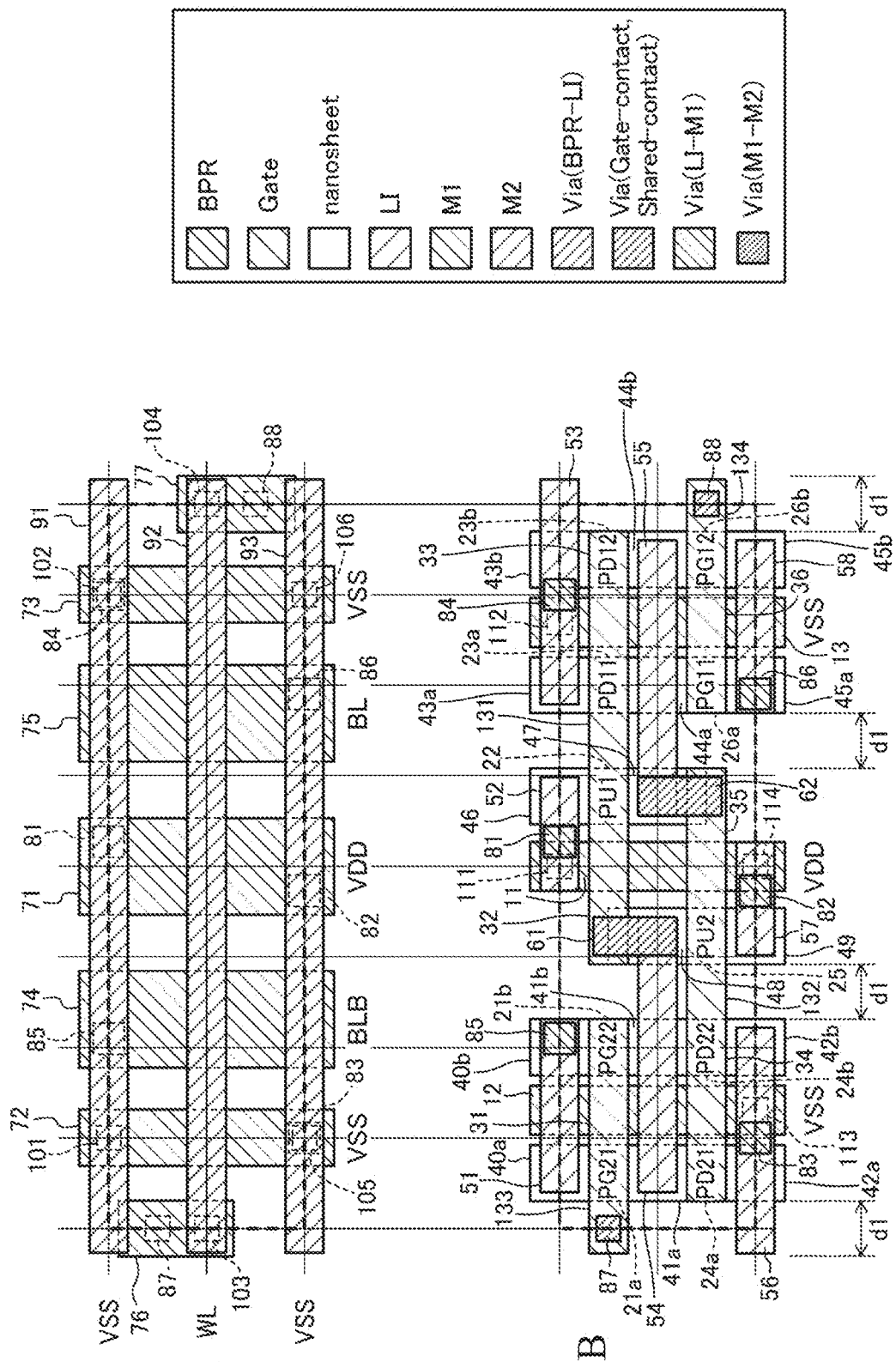

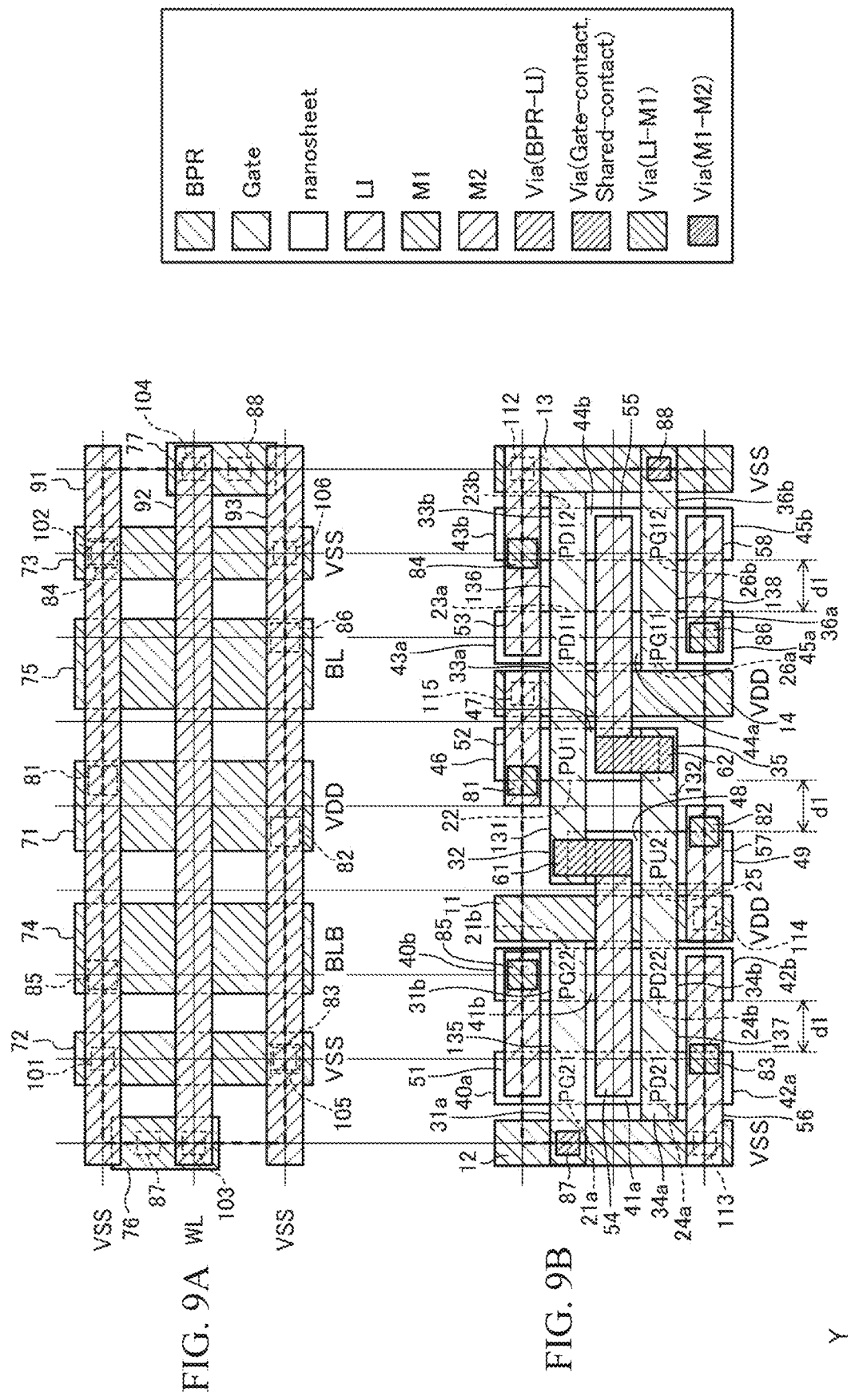

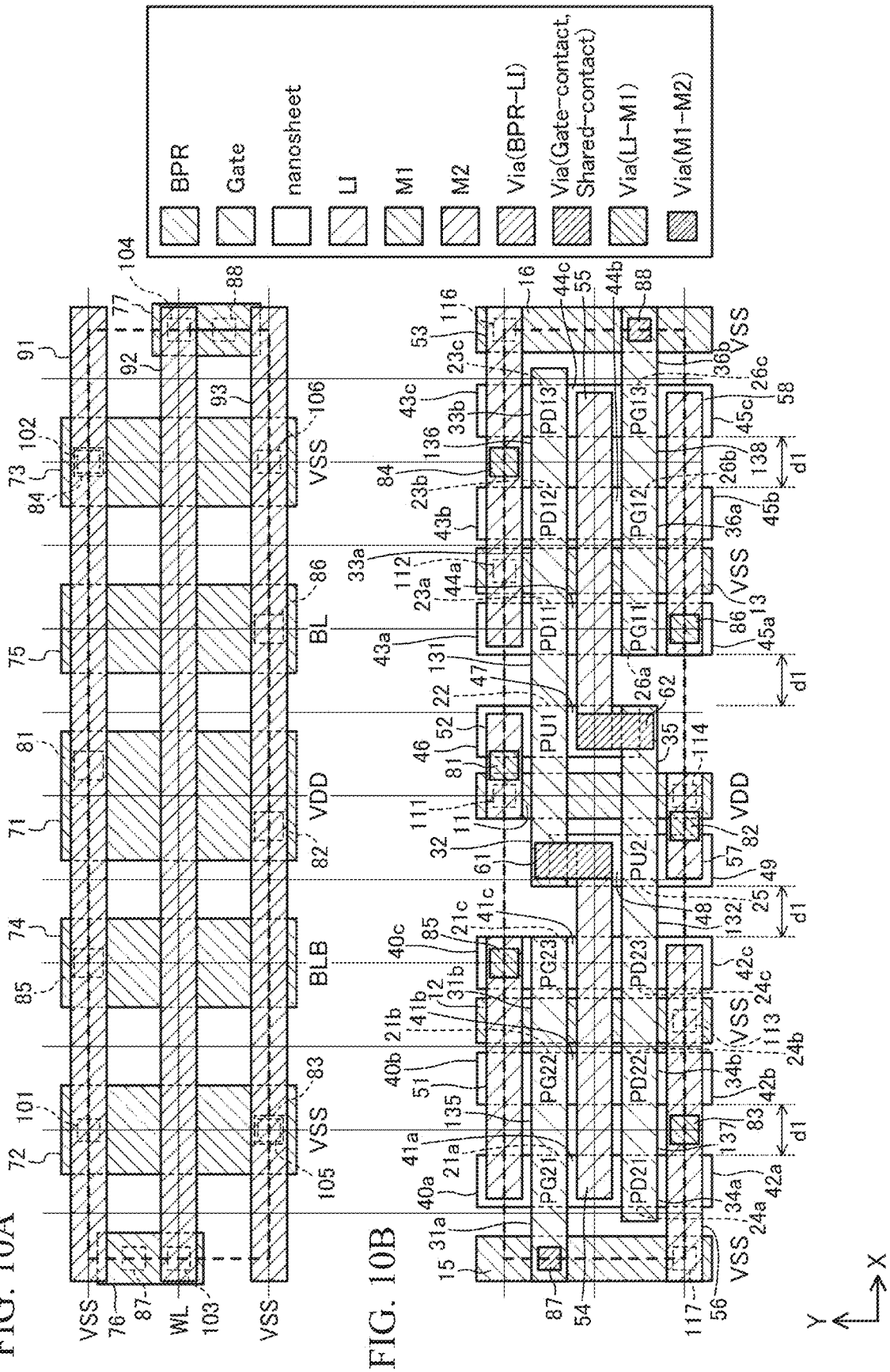

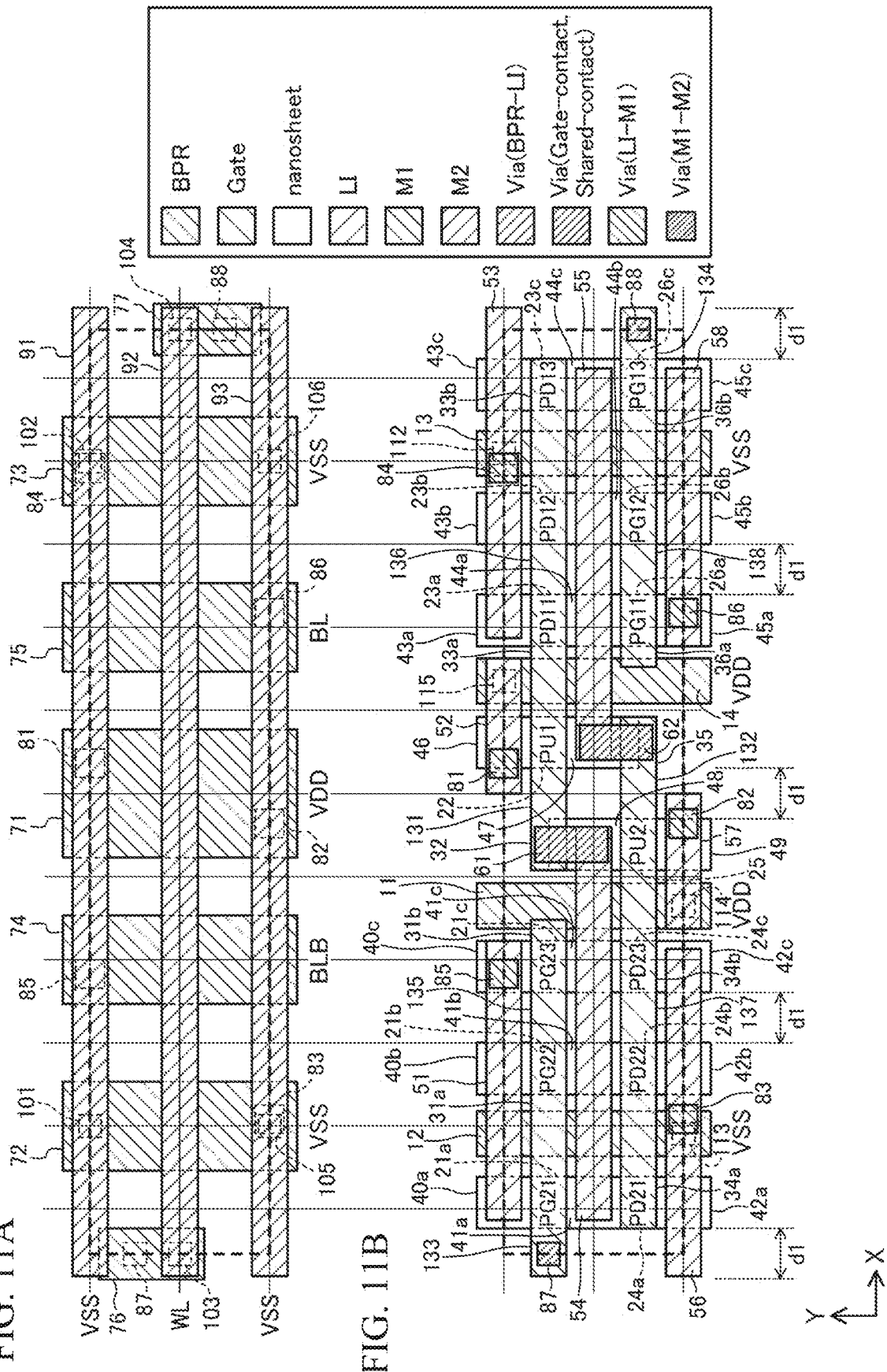

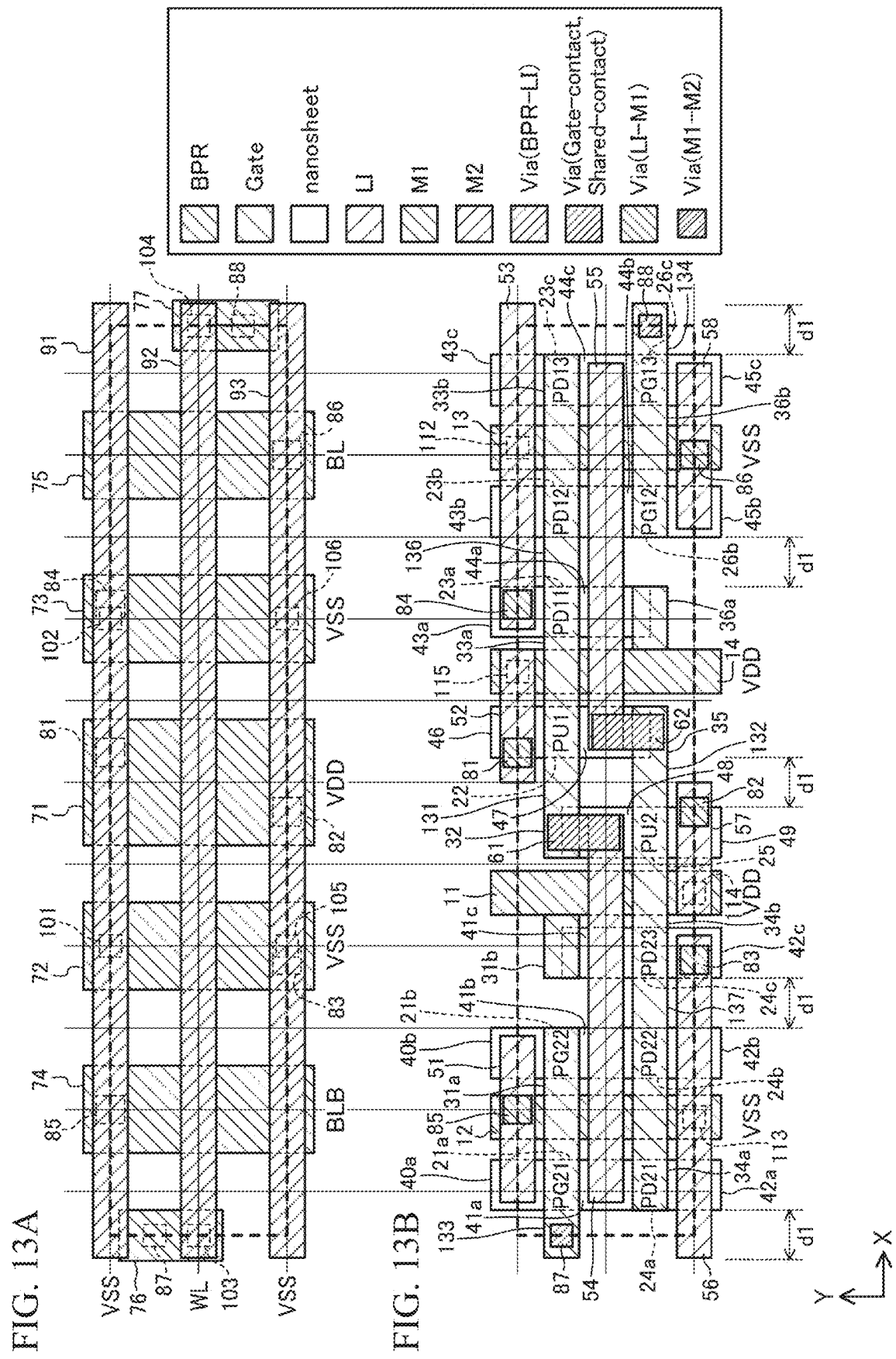

SEMICONDUCTOR STORAGE DEVICE

CROSS-REFERENCE TO RELATED APPLICATIONS

This is a Continuation of U.S. patent application Ser. No. 17/879,415, filed on Aug. 2, 2022, now U.S. Pat. No. 12,048,134, which is a Continuation of International Patent Application No. PCT/JP2021/003869, filed on Feb. 3, 2021, which claims priority to Japanese Patent Application No. 2020-026503, filed on Feb. 19, 2020. The entire disclosures of these applications are incorporated by reference herein.

BACKGROUND

The present disclosure relates to a semiconductor storage device provided with nanosheet field effect transistors (FETs), and more particularly to a layout structure of a one-port static random access memory (SRAM) cell (hereinafter simply called a cell as appropriate) using nanosheet FETs.

SRAM is widely used in semiconductor integrated circuits.

As for transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure, changed from the conventional planar structure, have been vigorously studied. As one type of such three-dimensional transistors, nanosheet FETs (nanowire FETs) have received attention.

Among other types of nanosheet FETs, a forksheet transistor having a gate electrode shaped like a fork is proposed. P. Weckx et al., "Stacked nanosheet fork architecture for SRAM design and device co-optimization toward 3 nm," 2017 IEEE International Electron Devices Meeting (IEDM), December 2017, IEDM17-505-508 (Document 1) and P. Weckx et al., "Novel forksheet device architecture as ultimate logic scaling device towards 2 nm," 2019 IEEE International Electron Devices Meeting (IEDM), December 2019, IEDM19-871-874 (Document 2) disclose a layout of an SRAM cell using forksheet transistors, whereby reduction in the area of a semiconductor storage device has been achieved.

Note that the nanosheet FET having a fork-shaped gate electrode is hereinafter called a forksheet transistor following the prior art.

In Document 1, however, regarding the one-port SRAM cell, only the structure of placement of transistors is illustrated, with no detailed examination including interconnects being made.

An objective of the present disclosure is achieving speedup and improved write characteristics of a semiconductor storage device while preventing increase in the area of the semiconductor storage device in a layout structure of a one-port SRAM cell using forksheet transistors.

SUMMARY

According to the first mode of the present disclosure, a semiconductor storage device including a one-port SRAM cell is provided. The one-port SRAM cell includes: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to the first node at one of its nodes, to a second power supply supplying a second voltage different from the first voltage at the other node, and to the second node at its gate; a fourth transistor connected to the second node at one of its nodes, to the second power supply at the other node, and to the first node at its gate; a fifth transistor connected to a first bit line at one of its nodes, to the first node at the other node, and to a word line at its gate; and a sixth transistor connected to a second bit line at one of its nodes, to the second node at the other node, and to the word line at its gate, the first bit line and the second bit line constituting a complementary bit line pair. The first to sixth transistors respectively include first to sixth nanosheets extending in a first direction, and first to sixth gate interconnects surrounding the first to sixth nanosheets, respectively, in a second direction vertical to the first direction and in a third direction perpendicular to the first and second directions. The sixth, first, and third nanosheets are formed in line in this order in the second direction. The fourth, second, and fifth nanosheets are formed in line in this order in the second direction. Faces of the first to sixth nanosheets on either one of sides in the second direction are exposed from the first to sixth gate interconnects, respectively. A first power line supplying the first voltage is formed to extend in the first direction between the first nanosheet and the second nanosheet as viewed in plan in a layer below the first to sixth transistors. A face of the first nanosheet on a second side in the second direction, which is opposite to a first side of the first nanosheet on which the first power line is formed, is exposed from the first gate interconnect. A face of the second nanosheet on the first side in the second direction, which is opposite to the second side of the second nanosheet on which the first power line is formed, is exposed from the second gate interconnect.

According to the present disclosure, the first power line supplying the first voltage is formed in a layer below the first to sixth transistors. Therefore, the width of an interconnect supplying the first voltage in a layer above the first to sixth transistors, for example, can be reduced (or such an interconnect can be omitted). This can increase the width of interconnects to serve as the first and second bit lines and, in turn, achieve speedup and improved write characteristics of the semiconductor storage device.

Also, the first power line is formed between the first nanosheet and the second nanosheet as viewed in plan. The faces of the first and second nanosheets opposite to each other in the second direction are not exposed from the first and second gate interconnects, respectively. That is, the first power line is formed between the first and second transistors the distance between which in the second direction is large, as viewed in plan. Therefore, increase in the area of the semiconductor storage device can be prevented.

Thus, in the layout structure of the one-port SRAM cell using forksheet transistors, it is possible to achieve speedup and improved write characteristics of the semiconductor storage device while preventing increase in the area of the semiconductor storage device.

According to the second mode of the present disclosure, a semiconductor storage device including a one-port SRAM cell is provided. The one-port SRAM cell includes: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to the first node at one of its nodes, to a second power supply supplying a second voltage different from the first voltage at the other node, and to the second node at its gate; a fourth transistor connected to the second node at one of its nodes, to the second power supply at the other node, and to the first node at its gate; a fifth transistor connected to a first bit line at one of its nodes, to the first node at the other node, and to a word line at its gate; and a sixth transistor connected to a second bit line at one of its nodes, to the second node at the other node, and to the word line at its gate, the first bit line and the second bit line constituting a complementary bit line pair. The first to sixth transistors respectively include first to sixth nanosheets extending in a first direction, and first to sixth gate interconnects surrounding the first to sixth nanosheets, respectively, in a second direction vertical to the first direction and in a third direction perpendicular to the first and second directions. The sixth, first, and third nanosheets are formed in line in this order in the second direction. The fourth, second, and fifth nanosheets are formed in line in this order in the second direction. Faces of the first to sixth nanosheets on either one of sides in the second direction are exposed from the first to sixth gate interconnects, respectively. A face of the first nanosheet on a first side that is the side opposed to the second nanosheet in the second direction is exposed from the first gate interconnect. A face of the second nanosheet on a second side that is the side opposed to the first nanosheet in the second direction is exposed from the second gate interconnect. A first power line supplying the first voltage or the second voltage is formed to extend in the first direction on the second side of the first nanosheet as viewed in plan in a layer below the first to sixth transistors. A second power line supplying the first voltage or the second voltage is formed to extend in the first direction on the first side of the second nanosheet as viewed in plan in a layer below the first to sixth transistors.

According to the present disclosure, the first power line supplying the first voltage or the second voltage is formed in a layer below the first to sixth transistors, and the second power line supplying the first voltage or the second voltage is formed in a layer below the first to sixth transistors. Therefore, the width of an interconnect supplying the first voltage or the second voltage in a layer above the first to sixth transistors, for example, can be reduced (or such an interconnect can be omitted). This can increase the width of interconnects to serve as the first and second bit lines and, in turn, achieve speedup and improved write characteristics of the semiconductor storage device.

Also, the first power line is formed on the first side of the second nanosheet as viewed in plan, and the second power line is formed on the second side of the first nanosheet as viewed in plan. The face of the second nanosheet on the first side is not exposed from the second gate interconnect, and the face of the first nanosheet on the second side is not exposed from the first gate interconnect. That is, the first power line is formed on the first side of the second transistor on which side the distance between transistors in the second direction is large as viewed in plan. The second power line is formed on the second side of the first transistor on which side the distance between transistors in the second direction is large as viewed in plan. Therefore, increase in the area of the semiconductor storage device can be prevented.

Thus, in the layout structure of the one-port SRAM cell using forksheet transistors, it is possible to achieve speedup and improved write characteristics of the semiconductor storage device while preventing increase in the area of the semiconductor storage device.

According to the third mode of the present disclosure, a semiconductor storage device including a one-port SRAM cell is provided. The one-port SRAM cell includes: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to the first node at one of its nodes, to a second power supply supplying a second voltage different from the first voltage at the other node, and to the second node at its gate; a fourth transistor connected to the second node at one of its nodes, to the second power supply at the other node, and to the first node at its gate; a fifth transistor connected to a first bit line at one of its nodes, to the first node at the other node, and to a word line at its gate; and a sixth transistor connected to a second bit line at one of its nodes, to the second node at the other node, and to the word line at its gate, the first bit line and the second bit line constituting a complementary bit line pair. The first and second transistors respectively include first and second nanosheets extending in a first direction, and first and second gate interconnects surrounding the first and second nanosheets, respectively, in a second direction vertical to the first direction and in a third direction perpendicular to the first and second directions. The third to sixth transistors respectively include third to sixth nanosheets, each including a plurality of nanosheets, extending in the first direction, and third to sixth gate interconnects surrounding the plurality of third nanosheets, the plurality of fourth nanosheets, the plurality of fifth nanosheets, and the plurality of sixth nanosheets, respectively, in the second and third directions. The plurality of sixth nanosheets, the first nanosheet, and the plurality of third nanosheets are formed in line in this order in the second direction. The plurality of fourth nanosheets, the second nanosheet, and the plurality of fifth nanosheets are formed in line in this order in the second direction. Faces of the first and second nanosheets on either one of sides in the second direction are exposed from the first and second gate interconnects, respectively. Faces of the plurality of third nanosheets each on either one of sides in the second direction are exposed from the third gate interconnect. Faces of the plurality of fourth nanosheets each on either one of sides in the second direction are exposed from the fourth gate interconnects. Faces of the plurality of fifth nanosheets each on either one of sides in the second direction are exposed from the fifth gate interconnects. Faces of the plurality of sixth nanosheets each on either one of sides in the second direction are exposed from the sixth gate interconnects. A plurality of power lines supplying the second voltage are formed to extend in the first direction in a layer below the first to sixth transistors. The plurality of third nanosheets include a third nanosheet on one side of which at least one of the plurality of power lines is formed, the one side being opposite in the second direction to the side on which the third nanosheet is exposed from the third gate interconnect, as viewed in plan. The plurality of fourth nanosheets include a fourth nanosheet on one side of which at least one of the plurality of power lines is formed, the one side being opposite in the second direction to the side on which the fourth nanosheet is exposed from the fourth gate interconnect, as viewed in plan. The plurality of fifth nanosheets include a fifth nanosheet on one side of which at least one of the plurality of power lines is formed, the one side being opposite in the second direction to the side on which the fifth nanosheet is exposed from the fifth gate interconnect, as viewed in plan. The plurality of sixth nanosheets include a sixth nanosheet on one side of which at least one of the plurality of power lines is formed, the one side being opposite in the second direction to the side on which the sixth nanosheet is exposed from the sixth gate interconnect, as viewed in plan.

According to the present disclosure, a plurality of power lines supplying the first voltage or the second voltage are formed in a layer below the first to sixth transistors. Therefore, the width of an interconnect supplying the first voltage or the second voltage in a layer above the first to sixth transistors, for example, can be reduced (or such an interconnect can be omitted). This can increase the width of interconnects to serve as the first and second bit lines and, in turn, achieve speedup and improved write characteristics of the semiconductor storage device.

Also, the plurality of third nanosheets include a third nanosheet on one side of which in the second direction a power line is formed, this side being the side on which the third nanosheet is not exposed from the third gate interconnect, as viewed in plan. The plurality of fourth nanosheets include a fourth nanosheet on one side of which in the second direction a power line is formed, this side being the side on which the fourth nanosheet is not exposed from the fourth gate interconnect, as viewed in plan. The plurality of fifth nanosheets include a fifth nanosheet on one side of which in the second direction a power line is formed, this side being the side on which the fifth nanosheet is not exposed from the fifth gate interconnect, as viewed in plan. The plurality of sixth nanosheets include a sixth nanosheet on one side of which in the second direction a power line is formed, this side being the side on which the sixth nanosheet is not exposed from the sixth gate interconnect, as viewed in plan. That is, the power lines are formed at positions where the distance between transistors in the second direction is large as viewed in plan. Therefore, increase in the area of the semiconductor storage device can be prevented.

Thus, in the layout structure of the one-port SRAM cell using forksheet transistors, it is possible to achieve speedup and improved write characteristics of the semiconductor storage device while preventing increase in the area of the semiconductor storage device.

According to the present disclosure, in the layout structure of a one-port SRAM cell using forksheet transistors, it is possible to achieve speedup and improved write characteristics of a semiconductor storage device while preventing increase in the area of the semiconductor storage device.

BRIEF DESCRIPTION OF THE DRAWINGS

FIGS. 1A-1B are plan views showing an example of the layout structure of a one-port SRAM cell according to the first embodiment.

FIGS. 2A-2C are cross-sectional views showing the layout structure of the one-port SRAM cell according to the first embodiment.

FIGS. 5A-5B are plan views showing another example of the layout structure of the one-port SRAM cell according to the first embodiment.

FIGS. 7A-7B are plan views showing yet another example of the layout structure of the one-port SRAM cell according to the first embodiment.

FIGS. 8A-8B are plan views showing an example of the layout structure of a one-port SRAM cell according to the second embodiment.

FIGS. 9A-9B are plan views showing another example of the layout structure of the one-port SRAM cell according to the second embodiment.

FIGS. 10A-10B are plan views showing an example of the layout structure of a one-port SRAM cell according to the third embodiment.

FIGS. 11A-11B are plan views showing another example of the layout structure of the one-port SRAM cell according to the third embodiment.

FIGS. 13A-13B are plan views showing yet another example of the layout structure of the one-port SRAM cell according to the third embodiment.

DETAILED DESCRIPTION

Embodiments of the present disclosure will be described hereinafter with reference to the accompanying drawings. In the following embodiments, it is assumed that the semiconductor storage device includes a plurality of SRAM cells (hereinafter simply called cells as appropriate), and at least some of the SRAM cells include forksheet transistors each having a fork-shaped gate electrode, among nanosheet FETs (nanowire FETs). The nanosheet FET is a FET using a thin sheet (nanosheet) through which a current flows. Such a nanosheet is formed of silicon, for example. In the semiconductor storage device, it is assumed that some of the nanosheet FETs are forksheet FETs.

In the present disclosure, a semiconductor layer portion formed on each end of a nanosheet to constitute a terminal that is to be the source or drain of a nanosheet FET is called a "pad." Also, hereinafter, in the plan views such as FIGS. 1A-1B, the vertical direction in the figure is called a Y direction (corresponding to the first direction), the horizontal direction in the figure is called an X direction (corresponding to the second direction), and the direction perpendicular to the substrate plane is called a Z direction (corresponding to the third direction).

Structure of Forksheet

Figure 14A:
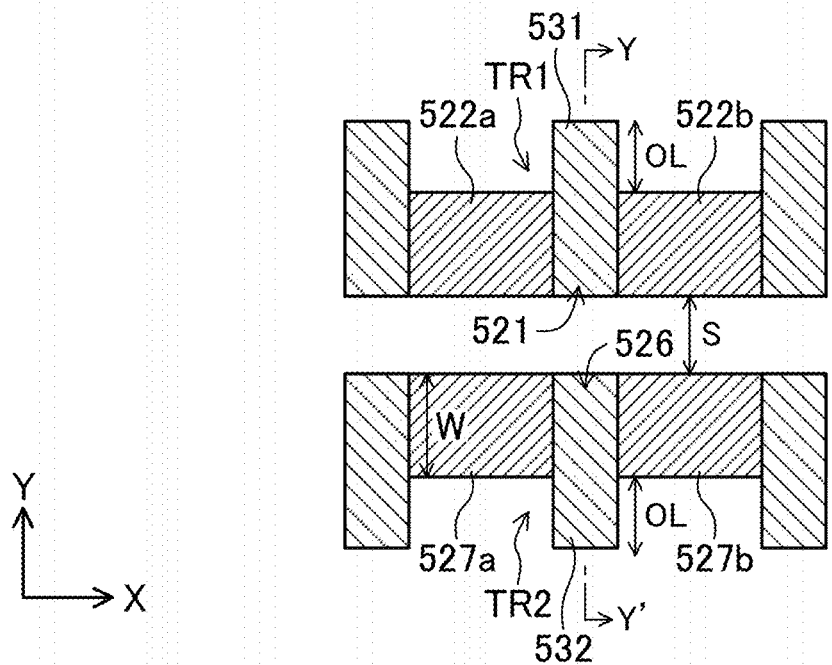
FIGS. 14A-14B are views showing a basic structure of a forksheet FET.
Figure 14B:
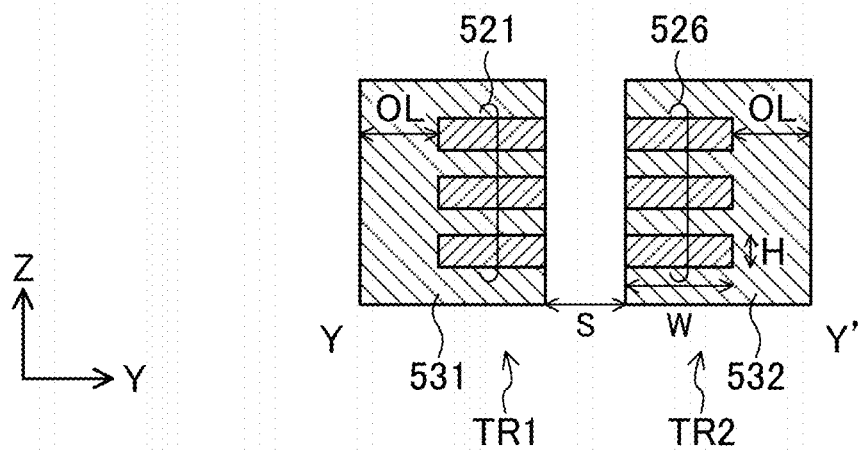

FIGS. 14A-14B are views showing a basic structure of a forksheet FET, where FIG. 14A is a plan view and FIG. 14B is a cross-sectional view taken along line Y-Y' in FIG. 14A. In the basic structure of FIGS. 14A-14B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 14A-14B, the channel portions 521 and 526 are each constituted by a stacked structure of three nanosheets coinciding with one another as viewed in plan.

Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via a gate insulating film (not shown). Note however that the faces of the nanosheets constituting the channel portion 521 on the side closer to the transistor TR2 in the Y direction are exposed, not covered with the gate interconnect 531. That is, in the cross-sectional view of FIG. 14B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via a gate insulating film (not shown). Note however that the faces of the nanosheets constituting the channel portion 526 on the side closer to the transistor TR1 in the Y direction are exposed, not covered with the gate interconnect 532. That is, in the cross-sectional view of FIG. 14B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 14A-14B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets. Also, while the cross-sectional shape of the nanosheets is illustrated as rectangular in FIG. 14B, it is not limited to this. For example, the shape may be square, circular, or oval.

The semiconductor storage device may include both fork-sheet FETs and other nanosheet FETs where a gate interconnect surrounds the entire peripheries of nanosheets, in a mixed manner.

As used herein, "VDD" and "VSS" refer to the power supply voltages or the power supplies themselves. Also, as used herein, an expression indicating that sizes such as widths are identical, like the "same wiring width," is to be understood as including a range of manufacturing variations.

In the plan views and the cross-sectional views in the following embodiments, illustration of various insulating films may be omitted. Also, nanosheets and pads on both ends of the nanosheets may be illustrated in simplified linear shapes.

The source and drain of a transistor are herein called the "nodes" of the transistor as appropriate. That is, one node of a transistor refers to the source or drain of the transistor, and both nodes of a transistor refer to the source and drain of the transistor.

In the following embodiments and alterations, like components are denoted by the same reference characters and description thereof may be omitted.

First Embodiment

Figures 3A, 3B:
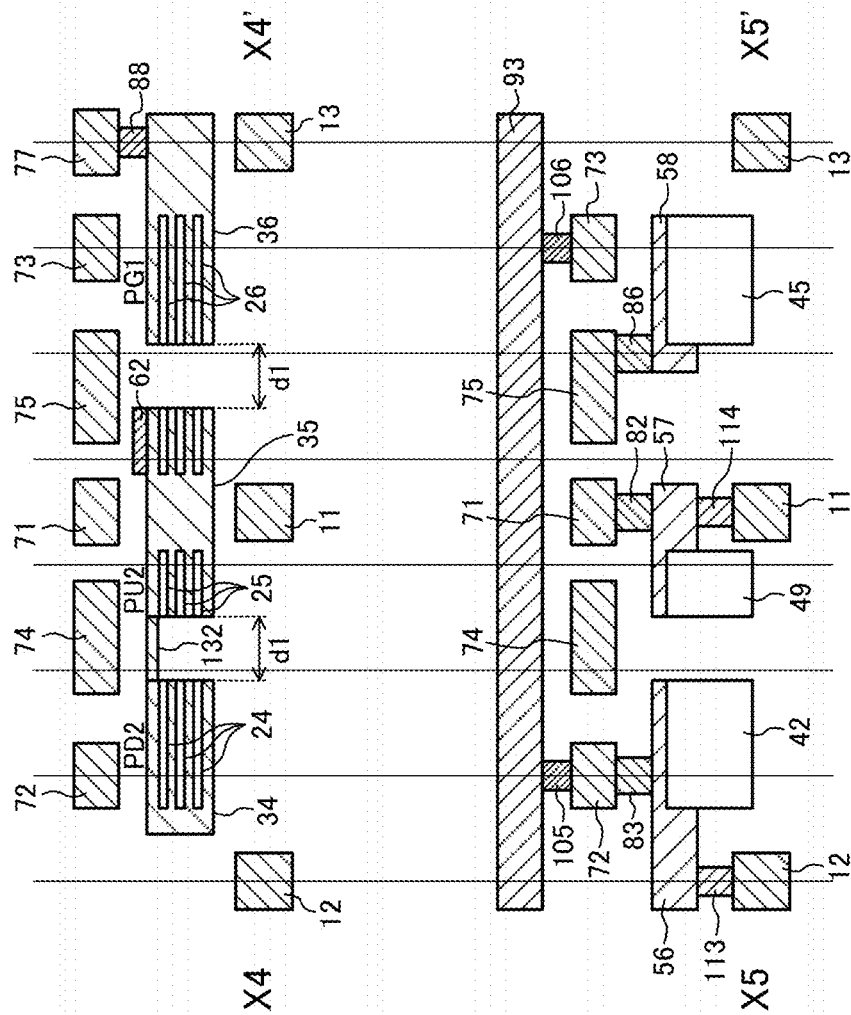
FIGS. 3A-3B are cross-sectional views showing the layout structure of the one-port SRAM cell according to the first embodiment.

FIGS. 1A-1B to FIGS. 3A-3B are views showing an example of the layout structure of a one-port SRAM cell according to the first embodiment, where FIGS. 1A and 1B are plan views, and FIGS. 2A to 2C, 3A, and 3B are cross-sectional views taken in the horizontal direction as viewed in plan. Specifically, FIG. 1A shows an upper part of the cell including M1 and M2 interconnect layers, and FIG. 1B shows a lower part of the cell that is lower than the M1 and M2 interconnect layers and includes nanosheet FETs. FIG. 2A shows a cross section taken along line X1-X1', FIG. 2B shows a cross section taken along line X2-X2', FIG. 2C shows a cross section taken along line X3-X3', FIG. 3A shows a cross section taken along line X4-X4', and FIG. 3B shows a cross section taken along line X5-X5'.

Figure 4:
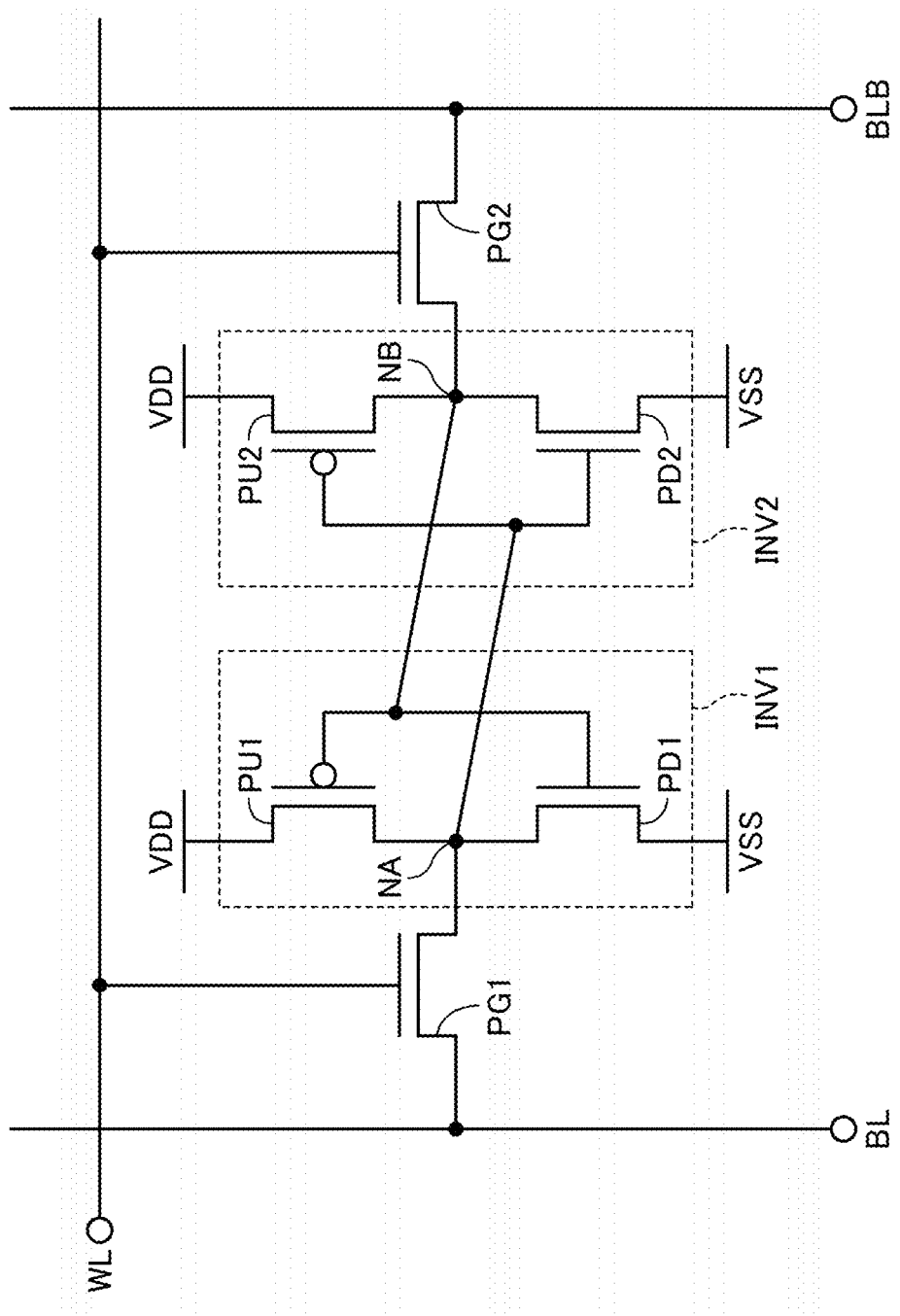
FIG. 4 is a circuit diagram showing a configuration of the one-port SRAM cell according to the first embodiment.

FIG. 4 is a circuit diagram showing a configuration of the one-port SRAM cell according to the first embodiment. As shown in FIG. 4, the one-port SRAM cell constitutes a one-port SRAM circuit including load transistors PU1 and PU2, drive transistors PD1 and PD2, and access transistors PG1 and PG2. The load transistors PU1 and PU2 are p-type FETs, and the drive transistors PD1 and PD2 and the access transistors PG1 and PG2 are n-type FETs.

The load transistor PU1 is provided between a power supply VDD and a first node NA, and the drive transistor PD1 is provided between the first node NA and a power supply VSS. The gates of the load transistor PU1 and the drive transistor PD1 are connected to a second node NB, whereby these transistors constitute an inverter INV1. The load transistor PU2 is provided between the power supply VDD and the second node NB, and the drive transistor PD2 is provided between the second node NB and the power supply VSS. The gates of the load transistor PU2 and the drive transistor PD2 are connected to the first node NA, whereby these transistors constitute an inverter INV2. That is, the output of one of the inverters is connected to the input of the other inverter, whereby a latch is formed.

The access transistor PG1 is provided between a bit line BL and the first node NA, and its gate is connected to a word line WL. The access transistor PG2 is provided between a bit line BLB and the second node NB, and its gate is connected to the word line WL. The bit lines BL and BLB constitute a complementary bit line pair.

In the one-port SRAM circuit, when the bit lines BL and BLB constituting the complementary bit line pair are driven to HIGH level and LOW level, respectively, and the word line WL is driven to HIGH level, HIGH level is written into the first node NA and LOW level is written into the second node NB. By contrast, when the bit lines BL and BLB are driven to LOW level and HIGH level, respectively, and the word line WL is driven to HIGH level, LOW level is written into the first node NA and HIGH level is written into the second node NB. In such a state where the first and second nodes NA and NB have written data, when the word line WL is driven to LOW level, a latched state is established, whereby the data written in the first and second nodes NA and NB are retained.

Also, when the bit lines BL and BLB are precharged to HIGH level in advance, and in this state, the word line WL is driven to HIGH level, the states of the bit lines BL and BLB are determined depending on the data written in the first and second nodes NA and NB, whereby read of data from the SRAM cell can be performed. Specifically, when the first node NA is in HIGH level and the second node NB is in LOW level, the bit line BL retains HIGH level and the bit line BLB is discharged to LOW level. By contrast, when the first node NA is in LOW level and the second node NB is in HIGH level, the bit line BL is discharged to LOW level and the bit line BLB retains HIGH level.

As described above, the one-port SRAM cell has functions of data write into the SRAM cell, data retention, and data read from the SRAM cell by controlling the bit lines BL and BLB and the word line WL.

Note that the solid lines running horizontally and vertically in the plan views such as FIGS. 1A-1B and the solid lines running vertically in the cross-sectional views such as FIGS. 2A-2C represent grid lines used for placement of components at the time of designing. The grid lines are arranged at equal spacing in the X direction and arranged at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

The dashed line drawn to surround a cell in the plan views such as FIGS. 1A-1B defines the bounds of the one-port SRAM cell (the outer rim of the one-port SRAM cell). The one-port SRAM cell is placed so that its rim touches a rim of a cell adjacent in the X direction or the Y direction.

In the plan views such as FIGS. 1A-1B, an inverted one of the one-port SRAM cell in the X direction is placed on each side of the one-port SRAM cell in the X direction, and an inverted one of the one-port SRAM cell in the Y direction is placed on each side of the one-port SRAM cell in the Y direction.

As shown in FIG. 1B, power lines 11 to 13 extending in the Y direction are formed across the cell from the upper to lower ends in the figure. The power lines 11 to 13 are buried power rails (BPRs) formed in a buried interconnect layer. The power line 11 is formed near the center of the cell in the figure, and the power lines 12 and 13 are formed along the left and right ends of the cell in the figure. The power line 11 supplies the power supply voltage VDD, and the power lines 12 and 13 supply the power supply voltage VSS.

As shown in FIG. 1B, nanosheets 21 to 26 extending in the X and Y directions are formed. The nanosheets 21 to 23 are arranged in this order in the X direction, and the nanosheets 24 to 26 are arranged in this order in the X direction. Also, the nanosheets 21 and 24 are formed side by side in the Y direction, and the nanosheets 23 and 26 are formed side by side in the Y direction.

The width of the nanosheets 21, 23, 24, and 26 is double the width of the nanosheets 22 and 25 in the X direction The nanosheets 21 and 24 are formed close to the cell boundary on the left side in the figure, and the nanosheets 23 and 26 are formed close to the cell boundary on the right side in the figure.

The nanosheets 21 to 26 constitute the channel portions of the access transistor PG2, the load transistor PU1, the drive transistor PD1, the drive transistor PD2, the load transistor PU2, and the access transistor PG1, respectively.

Gate interconnects (gates) 31 to 36 extend in the X and Z directions. The gate interconnects 31 to 33 are arranged in the X direction, and the gate interconnects 34 to 36 are arranged in the X direction.

The gate interconnects 31 to 36 overlap the nanosheets 21 to 26, respectively, as viewed in plan.

The gate interconnect 31 is to be the gate of the access transistor PG2, the gate interconnect 32 is to be the gate of the load transistor PU1, the gate interconnect 33 is to be the gate of the drive transistor PD1, the gate interconnect 34 is to be the gate of the drive transistor PD2, the gate interconnect 35 is to be the gate of the load transistor PU2, and the gate interconnect 36 is to be the gate of the access transistor PG1.

The gate interconnects 32 and 33 are mutually connected through a bridge 131 extending in the X direction. The gate interconnects 34 and 35 are mutually connected through a bridge 132 extending in the X direction.

Pads 40 to 45 doped with an n-type semiconductor are formed at the upper end of the nanosheets 21, between the nanosheets 21 and 24, at the lower end of the nanosheets 24, at the upper end of the nanosheets 23, between the nanosheets 23 and 26, and at the lower end of the nanosheets 26, respectively, as viewed in the figure. The pads 40 and 41 constitute the nodes of the access transistor PG2, the pads 41 and 42 constitute the nodes of the drive transistor PD2, the pads 43 and 44 constitute the nodes of the drive transistor PD1, and the pads 44 and 45 constitute the nodes of the access transistor PG1.

That is, the access transistor PG2 is constituted by the nanosheets 21, the gate interconnect 31, and the pads 40 and 41. The drive transistor PD1 is constituted by the nanosheets 23, the gate interconnect 33, and the pads 43 and 44. The drive transistor PD2 is constituted by the nanosheets 24, the gate interconnect 34, and the pads 41 and 42. The access transistor PG1 is constituted by the nanosheets 26, the gate interconnect 36, and the pads 44 and 45.

Pads 46 to 49 doped with a p-type semiconductor are formed at the upper end of the nanosheets 22, at the lower end of the nanosheets 22, at the upper end of the nanosheets 25, and at the lower end of the nanosheets 25, respectively, as viewed in the figure. The pads 46 and 47 constitute the nodes of the load transistor PU1, and the pads 48 and 49 constitute the nodes of the load transistor PU2.

That is, the load transistor PU1 is constituted by the nanosheets 22, the gate interconnect 32, and the pads 46 and 47. The load transistor PU2 is constituted by the nanosheets 25, the gate interconnect 35, and the pads 48 and 49.

Thus, the access transistor PG2, the load transistor PU1, and the drive transistor PD1 are formed in line in the X direction. The drive transistor PD2, the load transistor PU2, and the access transistor PG1 are formed in line in the X direction. Also, the access transistor PG2 and the drive transistor PD2 are formed side by side in the Y direction, and the drive transistor PD1 and the access transistor PG1 are formed side by side in the Y direction.

With the above arrangement, the transistors are placed symmetrically with respect to the center point of the cell. More specifically, the load transistors PU1 and PU2 are symmetric with respect to the cell center point, the drive transistors PD1 and PD2 are symmetric with respect to the cell center point, and the access transistors PG1 and PG2 are symmetric with respect to the cell center point.

In a local interconnect layer, local interconnects (LI) 51 to 58 extending in the X direction are formed. The local interconnect 51 is connected with the pad 40, the local interconnect 52 is connected with the pad 46, the local interconnect 53 is connected with the pad 43, the local interconnect 54 is connected with the pads 41 and 48, the local interconnect 55 is connected with the pads 47 and 44, the local interconnect 56 is connected with the pad 42, the local interconnect 57 is connected with the pad 49, and the local interconnect 58 is connected with the pad 45.

Also, the local interconnect 52 is connected with the power line 11 through a contact (via) 111, the local interconnect 53 is connected with the power line 13 through a contact 112, the local interconnect 56 is connected with the power line 12 through a contact 113, and the local interconnect 57 is connected with the power line 11 through a contact 114.

The local interconnect 54 is connected with the gate interconnect 32 through a shared contact 61, and the local interconnect 55 is connected with the gate interconnect 35 through a shared contact 62. The gate interconnects 34 and 35, the bridge 132, the local interconnect 55, and the shared contact 62 correspond to the first node NA. The gate interconnects 32 and 33, the bridge 131, the local interconnect 54, and the shared contact 61 correspond to the second node NB.

As shown in FIG. 1A, in the M1 interconnect layer, formed are interconnects 71 to 75 extending in the Y direction across the cell from the upper to lower ends in the figure. Also, interconnects 76 and 77 extending in the Y direction are formed. The interconnect 71 supplies the power supply voltage VDD, and the interconnects 72 and 73 supply the power supply voltage VSS. The interconnects 74 and 75 correspond to the bit lines BLB and BL, respectively. The interconnects 74 and 75 are placed symmetrically with respect to the center line of the cell in the X direction.

The interconnect 72, 74, 71, 75, and 73 are arranged in this order in the X direction. That is, the interconnect 71 is placed between the interconnects 74 and 75.

The interconnect 71 is connected with the local interconnect 52 through a contact (via) 81 and connected with the local interconnect 57 through a contact 82. The interconnect 72 is connected with the local interconnect 56 through a contact 83, and the interconnect 73 is connected with the local interconnect 53 through a contact 84. The interconnect 74 is connected with the local interconnect 51 through a contact 85, and the interconnect 75 is connected with the local interconnect 58 through a contact 86. The interconnect 76 is connected with the gate interconnect 31 through a contact (gate-contact) 87, and the interconnect 77 is connected with the gate interconnect 36 through a contact 88.

In the M2 interconnect layer above the M1 interconnect layer, formed are interconnects 91 to 93 extending in the X direction across the cell from the left to right ends in the figure. The interconnects 91 and 93 supply the power supply voltage VSS, and the interconnect 92 corresponds to the word line WL. The interconnect 92 is formed between the interconnects 91 and 93.

The interconnect 91 is connected with the interconnect 72 through a contact 101 and connected with the interconnect 73 through a contact 102. The interconnect 92 is connected with the interconnect 76 through a contact 103 and connected with the interconnect 77 through a contact 104. The interconnect 93 is connected with the interconnect 72 through a contact 105 and connected with the interconnect 73 through a contact 106.

As shown in FIGS. 2B and 3A, the nanosheets 21 to 26 are each constituted by three sheet-like semiconductors (nanosheets). The three nanosheets of each of the nanosheets 21 to 26 are stacked on top of one another with space between them in the Z direction. That is, each of the nanosheet FETs provided in the one-port SRAM according to this embodiment includes three nanosheets.

The peripheries of the nanosheets 21 to 26 in the X and Z directions are surrounded by the gate interconnects. Note however that portions of the peripheries of the nanosheets 21 to 26 in the X and Z directions are exposed, not covered with the gate interconnects.

More specifically, the right side faces of the nanosheets 21, 22, and 24 are exposed, not covered with the gate interconnects 31, 32, and 34, respectively. The left side faces of the nanosheets 23, 25, and 26 are exposed, not covered with the gate interconnects 33, 35, and 36, respectively.

That is, the faces of the nanosheets 22 and 23 opposed to each other in the X direction are exposed from the gate interconnects 32 and 33, respectively. The faces of the nanosheets 24 and 25 opposed to each other in the X direction are exposed from the gate interconnects 34 and 35, respectively.

Also, the left side faces of the nanosheets 21, 22, and 24 are not exposed but covered with the gate interconnects 31, 32, and 34, respectively. The right side faces of the nanosheets 23, 25, and 26 are not exposed but covered with the gate interconnects 33, 35, and 36, respectively.

The nanosheets 22 are formed at the upper right of the nanosheets 25 in the figure. That is, the faces of the nanosheets 22 and 25 opposed to each other in the X direction are not exposed from the gate interconnects 32 and 35, respectively.

Note that, since the nanosheets 22 and 25 are placed close to each other in the X direction although they are at positions different from each other in the Y direction as shown in FIGS. 1A-1B, it is herein considered that the nanosheets 22 and 25 are opposed to each other in the X direction. Therefore, the left side faces of the nanosheets 22 are opposed to the nanosheets 25 in the figure, and the right side faces of the nanosheets 25 are opposed to the nanosheets 22 in the figure. This also applies to the following description.

The nanosheets 21 and 24 are formed close to the cell boundary on the left side in the figure, and the nanosheets 23 and 26 are formed close to the cell boundary on the right side in the figure. One-port SRAM cells inverted in the X direction are placed on the left and right sides of the one-port SRAM cell of FIGS. 1A-1B. That is, in one-port SRAM cells placed side by side in the X direction, the faces of the nanosheets 21 opposed to each other in the X direction are not exposed from the gate interconnects 31. The faces of the nanosheets 23 opposed to each other in the X direction are not exposed from the gate interconnects 33. The faces of the nanosheets 24 opposed to each other in the X direction are not exposed from the gate interconnects 34. The faces of the nanosheets 26 opposed to each other in the X direction are not exposed from the gate interconnects 36.

In FIGS. 1A-1B, the power line 11 is formed between the nanosheets 22 and 25 as viewed in plan. The power lines 12 and 13 are formed along the cell boundaries on the left and right sides, respectively, as viewed in plan.

As shown in FIG. 1A, the width of the interconnects 74 and 75 in the X direction is larger than the width of the interconnects 76 and 77 in the X direction. The interconnects 76 and 77 are smallest in width in the X direction in the M1 interconnect layer. That is, the interconnects 74 and 75 are formed to be wider in the X direction than the narrowest interconnects in the M1 interconnect layer.

Having the above configuration, in the load transistor PU1, the pad 46 is connected to the interconnect 71 supplying VDD, the pad 47 is connected to the local interconnect 55 (the first node NA), and the gate interconnect 32 is connected to the shared contact 61 (the second node NB). In the load transistor PU2, the pad 49 is connected to the interconnect 71 supplying VDD, the pad 48 is connected to the local interconnect 54 (the second node NB), and the gate interconnect 35 is connected to the shared contact 62 (the first node NA). In the drive transistor PD1, the pad 44 is connected to the local interconnect 55 (the first node NA), the pad 43 is connected to the interconnect 73 supplying VSS, and the gate interconnect 33 is connected to the shared contact 61 (the second node NB). In the drive transistor PD2, the pad 41 is connected to the local interconnect 54 (the second node NB), the pad 42 is connected to the interconnect 72 supplying VSS, and the gate interconnect 34 is connected to the shared contact 62 (the first node NA). In the access transistor PG1, the pad 45 is connected to the interconnect 75 (the bit line BL), the pad 44 is connected to the local interconnect 55 (the first node NA), and the gate interconnect 36 is connected to the interconnect 92 (the word line WL). In the access transistor PG2, the pad 40 is connected to the interconnect 74 (the bit line BLB), the pad 41 is connected to the local interconnect 54 (the second node NB), and the gate interconnect 31 is connected to the interconnect 92 (the word line WL).

The load transistors PU1 and PU2, the drive transistors PD1 and PD2, and the access transistors PG1 and PG2 include the nanosheets 22, 25, 23, 24, 26, and 21 extending in the Y direction and the gate interconnects 32, 35, 33, 34, 36, and 31, respectively. The nanosheets 21 to 23 are formed in line in this order in the X direction, and the nanosheets 24 to 26 are formed in line in this order in the X direction. The gate interconnects 31 to 36 surround the peripheries of the nanosheets 21 to 26, respectively, in the X and Z directions. The right side faces of the nanosheets 21, 22, and 24 in the figure are exposed from the gate interconnects 31, 32, and 34, respectively. The left side faces of the nanosheets 23, 25, and 26 in the figure are exposed from the gate interconnects 33, 35, and 36, respectively. The nanosheets 22 are formed at the upper right of the nanosheets 25 as viewed in plan. In the buried interconnect layer, formed is the power line 11 extending in the Y direction between the nanosheets 22 and 25 as viewed in plan and supplying VDD.

That is, the load transistors PU1 and PU2, the drive transistors PD1 and PD2, and the access transistors PG1 and PG2 are each constituted by a forksheet transistor. Thus, a one-port SRAM cell using forksheet transistors is implemented.

Also, the faces of the nanosheets 22 and 23 opposed to each other in the X direction are exposed from the gate interconnects 32 and 33, and the faces of the nanosheets 24 and 25 opposed to each other in the X direction are exposed from the gate interconnects 34 and 35. This can reduce the distance d1 between the load transistor PU1 and the drive transistor PD1 and between the drive transistor PD2 and the load transistor PU2 in the X direction, whereby reduction in the area of the semiconductor storage device can be achieved.

Also, by forming the power line 11 in the buried interconnect layer, the width of the interconnect 71 supplying VDD in the X direction can be reduced in the M1 interconnect layer. As a result, the width of the interconnects 75 and 74 to serve as the bit lines BL and BLB in the X direction can be increased. It is therefore possible to achieve speedup and improved write characteristics of the semiconductor storage device.

The power line 11 is formed between the nanosheets 22 and 25 as viewed in plan, and the faces of the nanosheets 22 and 25 opposed to each other in the X direction are not exposed from the gate interconnects 32 and 35, respectively. The power line 11 is therefore formed between the load transistors PU1 and PU2, the distance between which is larger than the distance d1 in the X direction. That is, the power line 11 can be easily formed without the necessity of widening the spacing between the load transistors PU1 and PU2 in the X direction. This can prevent increase in the area of the semiconductor storage device.

Therefore, in the semiconductor storage device including a one-port SRAM cell using forksheet transistors, it is possible to achieve speedup and improved write characteristics while preventing area increase.

Also, by forming the power lines 12 and 13 supplying VSS in the buried interconnect layer, the width of the interconnects 72 and 73 supplying VSS in the X direction can be reduced in the M1 interconnect layer. As a result, the width of the interconnects 75 and 74 to serve as the bit lines BL and BLB in the X direction can be increased. It is therefore possible to achieve speedup and improved write characteristics of the semiconductor storage device.

The power lines 12 and 13 are formed along the left and right cell boundaries, respectively, as viewed in plan. In one-port SRAM cells placed side by side in the X direction, the faces of the nanosheets 21 opposed to each other in the X direction are not exposed from the gate interconnects 31, the faces of the nanosheets 23 opposed to each other in the X direction are not exposed from the gate interconnects 33, the faces of the nanosheets 24 opposed to each other in the X direction are not exposed from the gate interconnects 34, and the faces of the nanosheets 26 opposed to each other in the X direction are not exposed from the gate interconnects 36. The power line 12 is therefore formed between the drive transistors PD2, and between the access transistors PG2, the distance between which is larger than the distance d1 in the X direction. The power line 13 is formed between the drive transistors PD1, and between the access transistors PG1, the distance between which is larger than the distance d1 in the X direction. That is, the power line 12 can be easily formed without the necessity of widening the spacing between the access transistors PG2 and the spacing between the drive transistors PD2 in the X direction. The power line 13 can be easily formed without the necessity of widening the spacing between the drive transistors PD1 and the spacing between the access transistors PG1 in the X direction. This can prevent increase in the area of the semiconductor storage device.

Therefore, in the semiconductor storage device including a one-port SRAM cell using forksheet transistors, it is possible to achieve speedup and improved write characteristics while preventing area increase.

Also, the interconnect 71 supplying VDD and the interconnects 72 and 73 supplying VSS are formed in the M1 interconnect layer. That is, the interconnects supplying VDD or VSS are formed in both the M1 interconnect layer and the buried interconnect layer. It is therefore possible to reduce the resistance values of the interconnects supplying VDD and VSS in the buried interconnect layer while reducing the width of the interconnects supplying VDD and VSS in the X direction in the M1 interconnect layer. Thus, speedup of the semiconductor storage device can be achieved while increase in the area of the semiconductor storage device is prevented.

Also, in the M2 interconnect layer, the interconnects 91 and 93 supplying VSS are formed. The interconnect 92 (the word line WL) is formed between the interconnects 91 and 93. One-port SRAM cells inverted in the Y direction are placed on the upper and lower sides of the one-port SRAM cell of FIGS. 1A-1B. That is, in one-port SRAM cells placed side by side in the Y direction, the interconnect 91 or 93 is formed between the interconnects 92. This strengthens the supply of power to the one-port SRAM cells and also can prevent crosstalk between the word lines by the shielding function of the interconnects 91 and 93.

The width of the interconnects 74 and 75 in the X direction is larger than the width of the interconnects 76 and 77 in the X direction, and the interconnects 76 and 77 are smallest in width in the X direction in the M1 interconnect layer. That is, the interconnects 74 and 75 are formed to be wider in the X direction than the narrowest interconnects in the M1 interconnect layer. This makes it possible to achieve speedup of write and read through the interconnects 74 and 75 in the semiconductor storage device.

The load transistors PU1 and PU2 are placed symmetrically with respect to the cell center point, the drive transistors PD1 and PD2 are placed symmetrically with respect to the cell center point, and the access transistors PG1 and PG2 are placed symmetrically with respect to the cell center point. This makes uniform the characteristics of the bit lines BL and BLB and improves the operational stability and operating speed of the semiconductor storage device.

In the M1 interconnect layer, the interconnects 75 and 74 are placed symmetrically with respect to the center line of the cell in the X direction. That is, the interconnects corresponding to the bit lines BL and BLB are symmetric with respect to the cell center line in the X direction. This makes uniform the characteristics of the bit lines BL and BLB and improves the operational stability and operating speed of the semiconductor storage device.

While the width of the nanosheets 21, 23, 24, and 26 in the X direction is double the width of the nanosheets 22 and 25 in the X direction, the widths are not limited to these. The widths of the nanosheets 21 to 26 in the X direction (i.e., the gate widths of the transistors) may be determined considering the operational stability, etc. of the one-port SRAM circuit.

Some of the interconnects 71 to 73 may be omitted: at least one interconnect will suffice. This can increase the width of the interconnects 74 and 75 in the X direction and, in turn, achieve speedup and improved write characteristics of the semiconductor storage device.

Also, some of the power lines 11 to 13 may be omitted: at least one power line will suffice.

Alteration 1

Figures 6A, 6B:
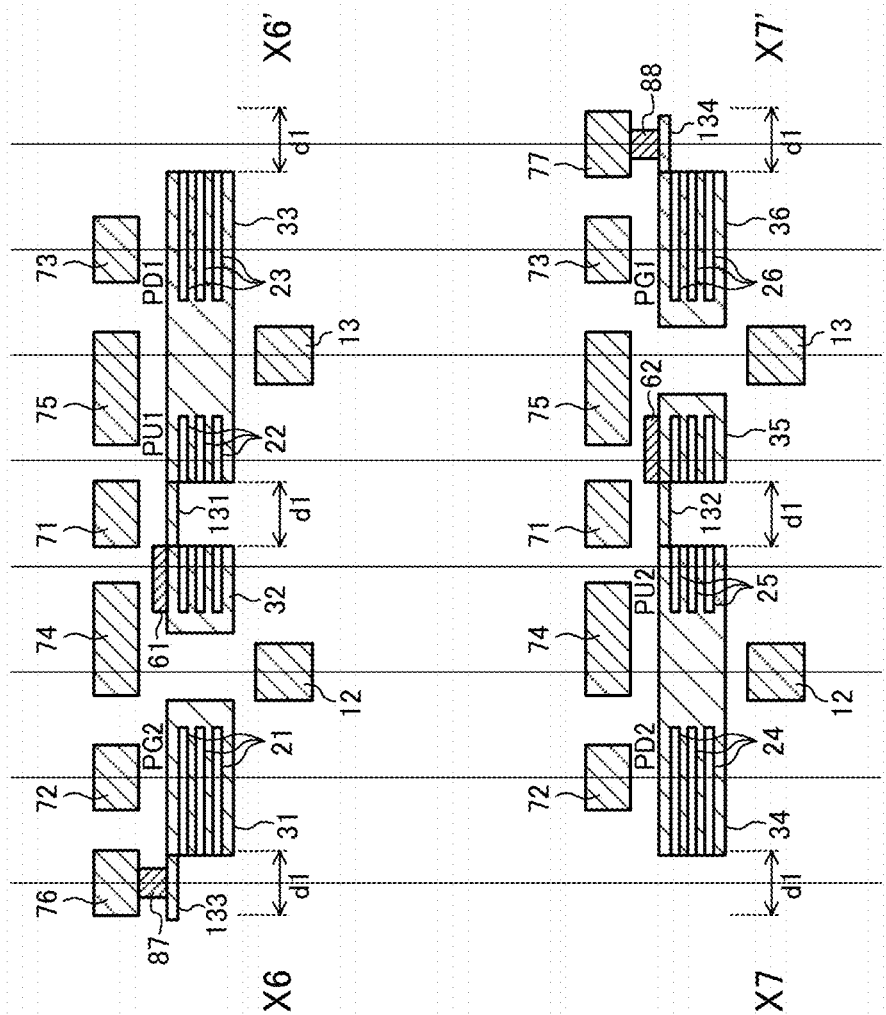
FIGS. 6A-6B are cross-sectional views showing the example of the layout structure of the one-port SRAM cell according to the first embodiment.

FIGS. 5A-5B are plan views, and FIGS. 6A-6B are cross-sectional views, showing another example of the layout structure of the one-port SRAM cell according to the first embodiment. Specifically, FIG. 5A shows an upper part of the cell, and FIG. 1B shows a lower part of the cell. FIG. 6A shows a cross section taken along line X6-X6', and FIG. 6B shows a cross section taken along line X7-X7'. In FIGS. 5A-5B, the faces of the nanosheets on the side opposite to the side in the case of FIGS. 1A-1B in the X direction are exposed from the gate interconnects. Also, the power line 11 is omitted, and the positions of the power lines 12 and 13 are different.

As shown in FIG. 5B, the gate interconnect 33 overlaps the nanosheets 22 and 23 as viewed in plan, and the gate interconnect 34 overlaps the nanosheets 24 and 25 as viewed in plan.

In FIGS. 5A-5B, the gate interconnect 33 is to be the gates of the load transistor PU1 and the drive transistor PD1. The gate interconnect 34 is to be the gates of the drive transistor PD2 and the load transistor PU2.

The gate interconnect 31 is connected with a gate interconnect 31 of a one-port SRAM cell placed on the left side of the subject one-port SRAM cell in the figure through a bridge 133. The gate interconnect 36 is connected with a gate interconnect 36 of a one-port SRAM cell placed on the right side of the subject one-port SRAM cell in the figure through a bridge 134.

The interconnect 76 is connected with the gate interconnect 31 through the contact 87 and the bridge 133. The interconnect 77 is connected with the gate interconnect 36 through the contact 88 and the bridge 134.

As shown in FIGS. 6A and 6B, the left side faces of the nanosheets 21, 22, and 24 are exposed, not covered with the gate interconnects 31, 33, and 34, respectively. The right side faces of the nanosheets 23, 25, and 26 are exposed, not covered with the gate interconnects 33, 34, and 36, respectively.

The nanosheets 21 and 24 are formed close to the cell boundary on the left side in the figure, and the nanosheets 23 and 26 are formed close to the cell boundary on the right side in the figure. One-port SRAM cells inverted in the X direction are placed on the left and right sides of the one-port SRAM cell of FIGS. 5A-5B. That is, in one-port SRAM cells placed side by side in the X direction, the faces of the nanosheets 21 opposed to each other in the X direction are exposed from the gate interconnects 31. The faces of the nanosheets 23 opposed to each other in the X direction are exposed from the gate interconnects 33. The faces of the nanosheets 24 opposed to each other in the X direction are exposed from the gate interconnects 34. The faces of the nanosheets 26 opposed to each other in the X direction are exposed from the gate interconnects 36.

Also, the nanosheets 22 are formed at the upper right of the nanosheets 25 in the figure. That is, the faces of the nanosheets 22 and 25 opposed to each other in the X direction are exposed from the gate interconnects 33 and 34, respectively.

The right side faces of the nanosheets 21, 22, and 24 are not exposed but covered with the gate interconnects 31, 33, and 34, respectively. The left side faces of the nanosheets 23, 25, and 26 are not exposed but covered with the gate interconnects 33, 34, and 36, respectively.

That is, the faces of the nanosheets 22 and 23 opposed to each other in the X direction are not exposed from the gate interconnect 33. The faces of the nanosheets 24 and 25 opposed to each other in the X direction are not exposed from the gate interconnect 34.

In FIGS. 5A-5B, the power line 12 is formed between the nanosheets 24 and 25 as viewed in plan, and the power line 13 is formed between the nanosheets 22 and 23 as viewed in plan.

According to the layout structure of FIGS. 5A-5B, in one-port SRAM cells placed side by side in the X direction, the faces of the nanosheets 21 opposed to each other in the X direction are exposed from the gate interconnects 31, the faces of the nanosheets 23 opposed to each other in the X direction are exposed from the gate interconnects 33, the faces of the nanosheets 24 opposed to each other in the X direction are exposed from the gate interconnects 34, and the faces of the nanosheets 26 opposed to each other in the X direction are exposed from the gate interconnects 36. It is therefore possible to reduce the distance d1 between the access transistors PG2 in the X direction, between the drive transistors PD1 in the X direction, between the drive transistors PD2 in the X direction, and between the access transistors PG1 in the X direction, and thus achieve reduction in the area of the semiconductor storage device.

Also, the faces of the nanosheets 22 and 25 opposed to each other in the X direction are exposed from the gate interconnects 33 and 34, respectively. This can reduce the distance between the load transistors PU1 and PU2 in the X direction, and thus achieve reduction in the area of the semiconductor storage device.

Also, the power lines 12 and 13 supplying VSS are formed in the buried interconnect layer. The power line 12 is formed between the nanosheets 24 and 25 as viewed in plan, and the power line 13 is formed between the nanosheets 22 and 23 as viewed in plan. The faces of the nanosheets 22 and 23 opposed to each other in the X direction are not exposed from the gate interconnect 33, and the faces of the nanosheets 24 and 25 opposed to each other in the X direction are not exposed from the gate interconnect 34. The power line 12 is therefore formed between the load transistor PU2 and the drive transistor PD2, the distance between which is larger than the distance d1 in the X direction. The power line 13 is formed between the load transistor PU1 and the drive transistor PD1 the distance between which is larger than the distance d1 in the X direction. That is, the power line 12 can be easily formed without the necessity of widening the spacing between the load transistor PU2 and the drive transistor PD2 in the X direction, and the power line 13 can be easily formed without the necessity of widening the spacing between the load transistor PU1 and the drive transistor PD1 in the X direction. This makes it possible to achieve speedup of the semiconductor storage device while preventing increase in the area of the semiconductor storage device.

In addition, similar effects to those obtained in the configuration of FIGS. 1A-1B can be obtained.

Note that, in place of either one or both of the power lines 12 and 13, a power line supplying VDD may be formed. In this case, the power line will be connected to either one or both of the pads 46 and 49 through a local interconnect and a contact.

Also, only either one of the power lines 12 and 13 will suffice.

Alteration 2

FIGS. 7A-7B are plan views showing yet another example of the layout structure of the one-port SRAM cell according to the first embodiment. Specifically, FIG. 7A shows an upper part of the cell, and FIG. 7B shows a lower part of the cell. In FIGS. 7A-7B, in comparison with FIGS. 1A-1B, some local interconnects are smaller in length in the X direction, and the shared contacts are smaller in width in the X direction.

For example, in FIG. 1B, the local interconnect 51 is formed so that its left end is aligned with the left end of the pad 40 in the figure. By contrast, in FIG. 7B, the local interconnect 51 is formed so that its left end is located near the center of the pad 40 in the X direction in the figure. In FIG. 7B, therefore, the length of the local interconnect 51 in the X direction is smaller than that in FIG. 1B. Similarly, other local interconnects are formed so that at least one of the two ends of each interconnect is located near the center of the corresponding pad, i.e., somewhere between the left and right ends of the pad in the figure. As a result, in FIG. 7B, in some local interconnects, the length in the X direction is smaller than that in FIG. 1B.

Also, in FIG. 1B, the shared contact 61 is formed so that its left and right ends are aligned with the left and right ends of the pad 48 in the figure, and the shared contact 62 is formed so that its left and right ends are aligned with the left and right ends of the pad 47 in the figure. By contrast, in FIG. 7B, the shared contact 61 is formed so that its left end is located to the right of the left end of the pad 48 and its right end is located to the left of the right end of the pad 48 in the figure. The shared contact 62 is formed so that its left end is located to the right of the left end of the pad 47 and its right end is located to the left of the right end of the pad 47, as viewed in the figure. As a result, in FIG. 7B, the width of the shared contacts 61 and 62 in the X direction is smaller than that in FIG. 1B.

According to the layout structure of FIGS. 7A-7B, compared with FIGS. 1A-1B, some local interconnects (e.g., the local interconnect 51) are smaller in length in the X direction, and the shared contacts 61 and 62 are smaller in width in the X direction. This can reduce the parasitic capacitance in the semiconductor integrated circuit and, in turn, achieve speedup of the semiconductor storage device.

In addition, similar effects to those obtained in the configuration of FIGS. 1A-1B can be obtained.

Second Embodiment

FIGS. 8A-8B are plan views showing an example of the layout structure of a one-port SRAM cell according to the second embodiment. Specifically, FIG. 8A shows an upper part of the cell, and FIG. 8B shows a lower part of the cell. In the one-port SRAM cell of FIGS. 8A-8B, the one-port SRAM circuit shown in FIG. 4 is constituted by the load transistors PU1 and PU2 and transistors PD11, PD12, PD21, PD22, PG11, PG12, PG21, and PG22. In FIGS. 8A-8B, each of the drive transistors PD1 and PD2 and the access transistors PG1 and PG2 is constituted by two transistors. Specifically, the drive transistor PD1 is constituted by the transistors PD11 and PD12, the drive transistor PD2 is constituted by the transistors PD21 and PD22, the access transistor PG1 is constituted by the transistors PG11 and PG12, and the access transistor PG2 is constituted by the transistors PG21 and PG22. Also, one-port SRAM cells inverted in the X direction are placed on the left and right sides of the one-port SRAM cell of FIGS. 8A-8B in the figure.

As shown in FIG. 8B, the power lines 11 to 13 are formed in the buried interconnect layer.

Nanosheets 21a, 21b, 22, 23a, 23b, 24a, 24b, 25, 26a, and 26b extending in the X and Y directions are formed. The nanosheets 21a, 21b, 22, 23a, and 23b are arranged in this order in the X direction, and the nanosheets 24a, 24b, 25, 26a, and 26b are arranged in this order in the X direction. Also, the nanosheets 21a and 24a are formed side by side in the Y direction, the nanosheets 21b and 24b are formed side by side in the Y direction, the nanosheets 23a and 26a are formed side by side in the Y direction, and the nanosheets 23b and 26b are formed side by side in the Y direction.

The nanosheets 21a, 21b, 22, 23a, 23b, 24a, 24b, 25, 26a, and 26b have the same width in the X direction.

In FIGS. 8A-8B, the nanosheets 21a, 21b, 23a, 23b, 24a, 24b, 26a, and 26b are to be the channel portions of the transistors PG21, PG22, PD11, PD12, PD21, PD22, PG11, and PG12, respectively.

The gate interconnect 31 overlaps the nanosheets 21a and 21b as viewed in plan, the gate interconnect 32 overlaps the nanosheets 22 as viewed in plan, the gate interconnect 33 overlaps the nanosheets 23a and 23b as viewed in plan, the gate interconnect 34 overlaps the nanosheets 24a and 24b as viewed in plan, the gate interconnect 35 overlaps the nanosheets 25 as viewed in plan, and the gate interconnect 36 overlaps the nanosheets 26a and 26b as viewed in plan.

In FIGS. 8A-8B, the gate interconnect 31 is to be the gates of the transistors PG21 and PG22, the gate interconnect 32 is to be the gate of the load transistor PU1, the gate interconnect 33 is to be the gates of the transistors PD11 and PD12, the gate interconnect 34 is to be the gates of the transistors PD21 and PD22, the gate interconnect 35 is to be the gate of the load transistor PU2, and the gate interconnect 36 is to be the gates of the transistors PG11 and PG12.

The gate interconnect 31 is connected with a gate interconnect 31 of a one-port SRAM cell placed on the left side of the subject one-port SRAM cell in the figure through the bridge 133. The gate interconnects 32 and 33 are mutually connected through the bridge 131. The gate interconnects 34 and 35 are mutually connected through the bridge 132. The gate interconnect 36 is connected with a gate interconnect 36 of a one-port SRAM cell placed on the right side of the subject one-port SRAM cell in the figure through the bridge 134.

Pads 40a, 41a, 42a, 40b, 41b, 42b, 43a, 44a, 45a, 43b, 44b, and 45b doped with an n-type semiconductor are formed at the upper end of the nanosheets 21a, between the nanosheets 21a and 24a, at the lower end of the nanosheets 24a, at the upper end of the nanosheets 21b, between the nanosheets 21b and 24b, at the lower end of the nanosheets 24b, at the upper end of the nanosheets 23a, between the nanosheets 23a and 26a, at the lower end of the nanosheets 26a, at the upper end of the nanosheets 23b, between the nanosheets 23b and 26b, and at the lower end of the nanosheets 26b, respectively, as viewed in the figure. The pads 40a and 41a constitute the nodes of the transistor PG21, the pads 41a and 42a constitute the nodes of the transistor PD21, the pads 40b and 41b constitute the nodes of the transistor PG22, the pads 41b and 42b constitute the nodes of the transistor PD22, the pads 43a and 44a constitute the nodes of the transistor PD11, the pads 44a and 45a constitute the nodes of the transistor PG11, the pads 43b and 44b constitute the nodes of the transistor PD12, and the pads 44b and 45b constitute the nodes of the transistor PG12.

With the above arrangement, in FIG. 8B, the transistors are placed symmetrically with respect to the center point of the cell. More specifically, the load transistors PU1 and PU2 are symmetric with respect to the cell center point, the transistors PD11 and PD22 are symmetric with respect to the cell center point, the transistors PD12 and PD21 are symmetric with respect to the cell center point, the transistors PG11 and PG22 are symmetric with respect to the cell center point, and the transistors PG12 and PG21 are symmetric with respect to the cell center point.

The local interconnect 51 is connected with the pads 40a and 40b, the local interconnect 53 is connected with the pads 43a and 43b, the local interconnect 54 is connected with the pads 41a, 41b, and 48, the local interconnect 55 is connected with the pads 47, 44a, and 44b, the local interconnect 56 is connected with the pads 42a and 42b, and the local interconnect 58 is connected with the pads 45a and 45b.

As in the example of FIGS. 7A-7B, some of the local interconnects 51 to 58 are formed so that at least one of the two ends of each interconnect is located somewhere between the left and right ends of a corresponding pad in the figure. For example, the left end of the local interconnect 51 is located somewhere between the left and right ends of the pad 40a in the figure.

Also, as in the example of FIGS. 7A-7B, the shared contact 61 is formed so that its left end is located to the right of the left end of the pad 48 and its right end is located to the left of the right end of the pad 48 in the figure. The shared contact 62 is formed so that its left end is located to the right of the left end of the pad 47 and its right end is located to the left of the right end of the pad 47 in the figure.

The left side faces of the nanosheets 21a, 23a, 24a, 25, and 26a are exposed, not covered with the gate interconnects 31, 33, 34, 35, and 36, respectively. The right side faces of the nanosheets 21b, 22, 23b, 24b, and 26b are exposed, not covered with the gate interconnects 31, 32, 33, 34, and 36, respectively.

That is, the faces of the nanosheets 22 and 23a opposed to each other in the X direction are exposed from the gate interconnects 32 and 33, respectively. The faces of the nanosheets 24b and 25 opposed to each other in the X direction are exposed from the gate interconnects 34 and 35, respectively.

The nanosheets 21a and 24a are formed close to the cell boundary on the left side in the figure, and the nanosheets 23b and 26b are formed close to the cell boundary on the right side in the figure. One-port SRAM cells inverted in the X direction are placed on the left and right sides of the one-port SRAM cell of FIGS. 8A-8B. That is, in one-port SRAM cells placed side by side in the X direction, the faces of the nanosheets 21a opposed to each other in the X direction are exposed from the gate interconnects 31. The faces of the nanosheets 23b opposed to each other in the X direction are exposed from the gate interconnects 33. The faces of the nanosheets 24a opposed to each other in the X direction are exposed from the gate interconnects 34. The faces of the nanosheets 26b opposed to each other in the X direction are exposed from the gate interconnects 36.

Also, the right side faces of the nanosheets 21a, 23a, 24a, 25, and 26a are not exposed but covered with the gate interconnects 31, 33, 34, 35, and 36, respectively. The left side faces of the nanosheets 21b, 22, 23b, 24b, and 26b are not exposed but covered with the gate interconnects 31, 32, 33, 34, and 36, respectively.

That is, the faces of the nanosheets 21a and 21b opposed to each other in the X direction are not exposed from the gate interconnect 31. The faces of the nanosheets 23a and 23b opposed to each other in the X direction are not exposed from the gate interconnect 33. The faces of the nanosheets 24a and 24b opposed to each other in the X direction are not exposed from the gate interconnect 34. The faces of the nanosheets 26a and 26b opposed to each other in the X direction are not exposed from the gate interconnect 36.

Also, the nanosheets 22 are formed at the upper right of the nanosheets 25 in the figure. That is, the faces of the nanosheets 22 and 25 opposed to each other in the X direction are not exposed from the gate interconnects 32 and 35, respectively.

In FIGS. 8A-8B, the power line 11 is formed between the nanosheets 22 and 25 as viewed in plan. The power line 12 is formed between the nanosheets 21a and 21b and between the nanosheets 24a and 24b as viewed in plan. The power line 13 is formed between the nanosheets 23a and 23b and between the nanosheets 26a and 26b as viewed in plan.

Having the above configuration, in one-port SRAM cells placed side by side in the X direction, the faces of the nanosheets 21a opposed to each other in the X direction are exposed from the gate interconnects 31, the faces of the nanosheets 23b opposed to each other in the X direction are exposed from the gate interconnects 33, the faces of the nanosheets 24a opposed to each other in the X direction are exposed from the gate interconnects 34, and the faces of the nanosheets 26b opposed to each other in the X direction are exposed from the gate interconnects 36. It is therefore possible to reduce the distance d1 between the transistors PG21 in the X direction, between the transistors PD12 in the X direction, between the drive transistors PD21 in the X direction, and between the access transistors PG12 in the X direction, and thus achieve reduction in the area of the semiconductor storage device.

Also, with the power line 11 supplying VDD and the power lines 12 and 13 supplying VSS formed in the buried interconnect layer, it is possible to reduce the width of the interconnect 71 supplying VDD in the X direction and the width of the interconnects 72 and 73 supplying VSS in the X direction in the M1 interconnect layer. As a result, the width of the interconnects 75 and 74 to serve as the bit lines BL and BLB in the X direction can be increased. It is therefore possible to achieve speedup and improved write characteristics of the semiconductor storage device.

Also, the power line 12 is formed between the nanosheets 21a and 21b and between the nanosheets 24a and 24b, and the power line 13 is formed between the nanosheets 23a and 23b and between the nanosheets 26a and 26b, as viewed in plan. The faces of the nanosheets 21a and 21b opposed to each other are not exposed from the gate interconnect 31. The faces of the nanosheets 23a and 23b opposed to each other are not exposed from the gate interconnect 33. The faces of the nanosheets 24a and 24b opposed to each other are not exposed from the gate interconnect 34. The faces of the nanosheets 26a and 26b opposed to each other are not exposed from the gate interconnect 36. The power line 12 is therefore formed between the transistors PG21 and PG22 and between the transistors PD21 and PD22, the distance between which is larger than the distance d1 in the X direction, as viewed in plan. The power line 13 is formed between the transistors PD11 and PD12 and between the transistors PG11 and PG12, the distance between which is larger than the distance d1 in the X direction, as viewed in plan. That is, the power line 12 can be easily formed without the necessity of widening the spacing between the transistors PG21 and PG22 and the spacing between the transistors PD21 and PD22 in the X direction. The power line 13 can be easily formed without the necessity of widening the spacing between the transistors PD11 and PD12 and the spacing between the transistors PG11 and PG12 in the X direction. This can prevent increase in the area of the semiconductor storage device.

Therefore, in the semiconductor storage device including a one-port SRAM cell using forksheet transistors, it is possible to achieve speedup and improved write characteristics while preventing area increase.

Also, the nanosheets 21a, 21b, 22, 23a, 23b, 24a, 24b, 25, 26a, and 26b have the same width in the X direction. This can make uniform the shape of the nanosheets of the semiconductor storage device, and thus improves the manufacture easiness.

Note that at least either one of the interconnects 71 to 73 will suffice. This can increase the width of the interconnects 74 and 75 in the X direction and, in turn, achieve speedup and improved write characteristics of the semiconductor storage device.

Also, at least one of the power lines 11 to 13 will suffice.

Alteration

FIGS. 9A-9B are plan views showing another example of the layout structure of the one-port SRAM cell according to the second embodiment. Specifically, FIG. 9A shows an upper part of the cell, and FIG. 9B shows a lower part of the cell. In FIGS. 9A-9B, the faces of the nanosheets on the side opposite to the side in the case of FIGS. 8A-8B in the X direction are exposed from the gate interconnects. Also, the positions of the power lines formed in the buried interconnect layer are different.

Power lines 11 to 14 extending in the Y direction are formed in the buried interconnect layer. The power lines 11 and 14 supply VDD, and the power lines 12 and 13 supply VSS.

As shown in FIG. 9B, gate interconnects 31a, 31b, 32, 33a, 33b, 34a, 34b, 35, 36a, and 36b extending in the X and Z directions are formed. The gate interconnect 31a overlaps the nanosheet 21a as viewed in plan, the gate interconnect 31b overlaps the nanosheet 21b as viewed in plan, the gate interconnect 33a overlaps the nanosheets 22 and 23a as viewed in plan, the gate interconnect 33b overlaps the nanosheet 23b as viewed in plan, the gate interconnect 34a overlaps the nanosheet 24a as viewed in plan, the gate interconnect 34b overlaps the nanosheets 24b and 25 as viewed in plan, the gate interconnect 36a overlaps the nanosheet 26a as viewed in plan, and the gate interconnect 36b overlaps the nanosheet 26b as viewed in plan.

In FIGS. 9A-9B, the gate interconnect 31a is to be the gate of the transistor PG21, the gate interconnect 31b is to be the gate of the transistor PG22, the gate interconnect 33a is to be the gates of the load transistor PU1 and the transistor PD11, the gate interconnect 33b is to be the gate of the transistor PD12, the gate interconnect 34a is to be the gate of the transistor PD21, the gate interconnect 34b is to be the gates of the transistor PD22 and the load transistor PU2, the gate interconnect 36a is to be the gate of the transistor PG11, and the gate interconnect 36b is to be the gate of the transistor PG12.

The gate interconnects 31a and 31b are mutually connected through a bridge 135, the gate interconnects 32 and 33a are mutually connected through the bridge 131, the gate interconnects 33a and 33b are mutually connected through a bridge 136, the gate interconnects 34a and 34b are mutually connected through a bridge 137, the gate interconnects 34b and 35 are mutually connected through the bridge 132, and the gate interconnects 36a and 36b are mutually connected through a bridge 138.

The local interconnect 52 is connected with the power line 14 through a contact 115, and the local interconnect 57 is connected with the power line 11 through the contact 114.

The interconnect 76 is connected with the gate interconnect 31a through the contact 87, and the interconnect 77 is connected with the gate interconnect 36a through the contact 88.

In FIGS. 9A-9B, the right side faces of the nanosheets 21a, 23a, 24a, 25, and 26a are exposed, not covered with the gate interconnects 31a, 33a, 34a, 34b, 36a, respectively. The left side faces of the nanosheets 21b, 22, 23b, 24b, and 26b are exposed, not covered with the gate interconnects 31b, 33a, 33b, 34b, and 36b, respectively.

That is, the faces of the nanosheets 21a and 21b opposed to each other in the X direction are exposed from the gate interconnects 31a and 31b, respectively. The faces of the nanosheets 23a and 23b opposed to each other in the X direction are exposed from the gate interconnects 33a and 33b, respectively. The faces of the nanosheets 24a and 24b opposed to each other in the X direction are exposed from the gate interconnects 34a and 34b, respectively. The faces of the nanosheets 26a and 26b opposed to each other in the X direction are exposed from the gate interconnects 36a and 36b, respectively.

Also, the nanosheets 22 are formed at the upper right of the nanosheets 25 in the figure. That is, the faces of the nanosheets 22 and 25 opposed to each other in the X direction are exposed from the gate interconnects 33a and 34b, respectively.

The left side faces of the nanosheets 21a, 23a, 24a, 25, and 26a are not exposed but covered with the gate interconnects 31a, 33a, 34a, 34b, and 36a, respectively. The right side faces of the nanosheets 21b, 22, 23b, 24b, and 26b are not exposed but covered with the gate interconnects 31b, 33a, 33b, 34b, and 36b, respectively.

That is, the faces of the nanosheets 22 and 23a opposed to each other in the X direction are not exposed from the gate interconnect 33a. The faces of the nanosheets 24b and 25 opposed to each other in the X direction are not exposed from the gate interconnect 34b.

Also, the nanosheets 21a and 24a are formed close to the cell boundary on the left side in the figure, and the nanosheets 23b and 26b are formed close to the cell boundary on the right side in the figure. One-port SRAM cells inverted in the X direction are placed on the left and right sides of the one-port SRAM cell of FIGS. 9A-9B. That is, in one-port SRAM cells placed side by side in the X direction, the faces of the nanosheets 21a opposed to each other in the X direction are not exposed from the gate interconnects 31a. The faces of the nanosheets 23b opposed to each other in the X direction are not exposed from the gate interconnects 33b. The faces of the nanosheets 24a opposed to each other in the X direction are not exposed from the gate interconnects 34a. The faces of the nanosheets 26b opposed to each other in the X direction are not exposed from the gate interconnects 36b.

In FIGS. 9A-9B, the power line 11 is formed between the nanosheets 24b and 25 as viewed in plan. The power line 12 is formed along the cell boundary on the left side, and the power line 13 is formed along the cell boundary on the right side, as viewed in plan. The power line 14 is formed between the nanosheets 22 and 23a as viewed in plan.

According to the layout structure of FIGS. 9A-9B, the faces of the nanosheets 21a and 21b opposed to each other in the X direction are exposed from the gate interconnects 31a and 31b, the faces of the nanosheets 23a and 23b opposed to each other in the X direction are exposed from the gate interconnects 33a and 33b, the faces of the nanosheets 24a and 24b opposed to each other in the X direction are exposed from the gate interconnects 34a and 34b, and the faces of the nanosheets 26a and 26b opposed to each other in the X direction are exposed from the gate interconnects 36a and 36b. It is therefore possible to reduce the distance d1 between the transistors PG21 and PG22, between the transistors PD11 and PD12, between the transistors PD21 and PD22, and between the transistors PG11 and PG12, in the X direction, and thus achieve reduction in the area of the semiconductor storage device.

Also, the power lines 11 and 14 supplying VDD are formed in the buried interconnect layer. The power line 11 is formed between the nanosheets 24b and 25, and the power line 14 is formed between the nanosheets 22 and 23a, as viewed in plan. The faces of the nanosheets 22 and 23a opposed to each other in the X direction are not exposed from the gate interconnect 33a, and the faces of the nanosheets 24b and 25 opposed to each other in the X direction are not exposed from the gate interconnect 34b. The power line 11 is therefore formed between the transistor PD22 and the load transistor PU2, the distance between which is larger than the distance d1 in the X direction. The power line 14 is formed between the load transistor PU1 and the transistor PD11, the distance between which is larger than the distance d1 in the X direction. That is, the power line 11 can be easily formed without the necessity of widening the spacing between the transistor PD22 and the load transistor PU2 in the X direction, and the power line 14 can be easily formed without the necessity of widening the spacing between the load transistor PU1 and the transistor PD11 in the X direction. This makes it possible to achieve speedup of the semiconductor storage device while preventing increase in the area of the semiconductor storage device.

The power lines 12 and 13 supplying VSS are also formed in the buried interconnect layer. The power lines 12 and 13 are formed along the cell boundaries on the left and right sides, respectively, as viewed in plan. In one-port SRAM cells placed side by side in the X direction, the faces of the nanosheets 21a opposed to each other in the X direction are not exposed from the gate interconnects 31a, the faces of the nanosheets 23b opposed to each other in the X direction are not exposed from the gate interconnects 33b, the faces of the nanosheets 24a opposed to each other in the X direction are not exposed from the gate interconnects 34a, and the faces of the nanosheets 26b opposed to each other in the X direction are not exposed from the gate interconnects 36b. The power line 12 is therefore formed between the transistors PG21 and between the transistors PD21, the distance between which is larger than the distance d1 in the X direction as viewed in plan. The power line 13 is formed between the transistors PD12 and between the transistors PG12, the distance between which is larger than the distance d1 in the X direction as viewed in plan. That is, the power line 12 can be easily formed without the necessity of widening the spacing between the transistors PG21 and the spacing between the transistors PD21. The power line 13 can be easily formed without the necessity of widening the spacing between the transistors PD12 and the spacing between the transistors PG12. This makes it possible to achieve speedup of the semiconductor storage device while preventing increase in the area of the semiconductor storage device.

In addition, similar effects to those obtained in the configuration of FIGS. 8A-8B can be obtained.

Note that at least one of the power lines 11 to 14 will suffice.

Third Embodiment

FIGS. 10A-10B are plan views showing an example of the layout structure of a one-port SRAM cell according to the third embodiment. Specifically, FIG. 10A shows an upper part of the cell, and FIG. 10B shows a lower part of the cell. In the one-port SRAM cell of FIGS. 10A-10B, the one-port SRAM circuit shown in FIG. 4 is constituted by the load transistors PU1 and PU2 and transistors PD11, PD12, PD13, PD21, PD22, PD23, PG11, PG12, PG13, PG21, PG22, and PG23. In FIGS. 10A-10B, each of the drive transistors PD1 and PD2 and the access transistors PG1 and PG2 is constituted by three transistors. Specifically, the drive transistor PD1 is constituted by the transistors PD11, PD12, and PD13, the drive transistor PD2 is constituted by the transistors PD21, PD22, and PD23, the access transistor PG1 is constituted by the transistors PG11, PG12, and PG13, and the access transistor PG2 is constituted by the transistors PG21, PG22, and PG23. Also, one-port SRAM cells inverted in the X direction are placed on the left and right sides of the one-port SRAM cell of FIGS. 10A-10B in the figure.

As shown in FIG. 10B, power lines 11 to 13, 15, and 16 extending in the Y direction are formed in the buried interconnect layer. The power line 11 supplies VDD, and the power lines 12, 13, 15, and 16 supply VSS.

Nanosheets 21a to 21c, 22, 23a to 23c, 24a to 24c, 25, and 26a to 26c extending in the X and Y directions are formed. The nanosheets 21a, 21b, 21c, 22, 23a, 23b, and 23c are arranged in this order in the X direction, and the nanosheets 24a, 24b, 24c, 25, 26a, 26b, and 26c are arranged in this order in the X direction. The nanosheets 21a, 21b, 21c, 23a, 23b, and 23c are formed side by side in the Y direction with the nanosheets 24a, 24b, 24c, 25, 26a, 26b, and 26c, respectively.

In FIGS. 10A-10B, the nanosheets 21a to 21c, 22, 23a to 23c, 24a to 24c, 25, and 26a to 26c have the same width in the X direction.

In FIGS. 10A-10B, the nanosheets 21a, 21b, 21c, 23a, 23b, 23c, 24a, 24b, 24c, 26a, 26b, and 26c are to be the channel portions of the transistors PG21, PG22, PG23, PD11, PD12, PD13, PD21, PD22, PD23, PG11, PG12, and PG13, respectively.

The gate interconnect 31a overlaps the nanosheets 21a as viewed in plan, the gate interconnect 31b overlaps the nanosheets 21b and 21c as viewed in plan, the gate interconnect 32 overlaps the nanosheets 22 as viewed in plan, the gate interconnect 33a overlaps the nanosheets 23a and 23b as viewed in plan, the gate interconnect 33b overlaps the nanosheets 23c as viewed in plan, the gate interconnect 34a overlaps the nanosheets 24a as viewed in plan, the gate interconnect 34b overlaps the nanosheets 24b and 24c as viewed in plan, the gate interconnect 35 overlaps the nanosheets 25 as viewed in plan, the gate interconnect 36a overlaps the nanosheets 26a and 26b as viewed in plan, and the gate interconnect 36b overlaps the nanosheets 26c as viewed in plan.

In FIGS. 10A-10B, the gate interconnect 31a is to be the gate of the transistor PG21, the gate interconnect 31b is to be the gates of the transistors PG22 and PG23, the gate interconnect 32 is to be the gate of the load transistor PU1, the gate interconnect 33a is to be the gates of the transistors PD11 and PD12, the gate interconnect 33b is to be the gate of the transistor PD13, the gate interconnect 34a is to be the gate of the transistor PD21, the gate interconnect 34b is to be the gates of the transistors PD22 and PD23, the gate interconnect 35 is to be the gate of the load transistor PU2, the gate interconnect 36a is to be the gates of the transistors PG11 and PG12, and the gate interconnect 36b is to be the gate of the transistor PG13.

The gate interconnects 31a and 31b are mutually connected through the bridge 135, the gate interconnects 32 and 33a are mutually connected through the bridge 131, the gate interconnects 33a and 33b are mutually connected through the bridge 136, the gate interconnects 34a and 34b are mutually connected through the bridge 137, the gate interconnects 34b and 35 are mutually connected through the bridge 132, the gate interconnects 36a and 36b are mutually connected through the bridge 138.

Pads 40c, 41c, 42c, 43c, 44c, and 45c doped with an n-type semiconductor are formed at the upper end of the nanosheets 21c, between the nanosheets 21c and 24c, at the lower end of the nanosheets 24c, at the upper end of the nanosheets 23c, between the nanosheets 23c and 26c, and at the lower end of the nanosheets 26c, respectively, in the figure. The pads 40c and 41c constitute the nodes of the transistor PG23, the pads 41c and 42c constitute the nodes of the transistor PD23, the pads 43c and 44c constitute the nodes of the transistor PD13, and the pads 44c and 45c constitute the nodes of the transistor PG13.

With the above arrangement, in FIG. 10B, the transistors are placed symmetrically with respect to the center point of the cell. More specifically, the load transistors PU1 and PU2 are symmetric with respect to the cell center point, the transistors PD11 and PD23 are symmetric with respect to the cell center point, the transistors PD12 and PD22 are symmetric with respect to the cell center point, the transistors PD13 and PD21 are symmetric with respect to the cell center point, the transistors PG11 and PG23 are symmetric with respect to the cell center point, the transistors PG12 and PG22 are symmetric with respect to the cell center point, and the transistors PG13 and PG21 are symmetric with respect to the cell center point.

The local interconnect 51 is connected with the pads 40a, 40b, and 40c. The local interconnect 53 is connected with the pads 43a, 43b, and 43c. The local interconnect 54 is connected with the pads 41a, 41b, 41c, and 48. The local interconnect 55 is connected with the pads 47, 44a, 44b, and 44c. The local interconnect 56 is connected with the pads 42a, 42b, and 42c. The local interconnect 58 is connected with the pads 45a, 45b, and 45c.

Also, the local interconnect 53 is connected with the power line 16 through a contact 116, and the local interconnect 56 is connected with the power line 15 through a contact 117.

As in the example of FIGS. 7A-7B, some of the local interconnects 51 to 58 are formed so that at least one of the two ends of each interconnect is located somewhere between the left and right ends of the corresponding pad in the figure. For example, the left end of the local interconnect 51 is located somewhere between the left and right ends of the pad 40a in the figure.

Also, as in the example of FIGS. 7A-7B, the shared contact 61 is formed so that its left end is located to the right of the left end of the pad 48 and its right end is located to the left of the right end of the pad 48 in the figure. The shared contact 62 is formed so that its left end is located to the right of the left end of the pad 47 and its right end is located to the left of the right end of the pad 47 in the figure.

The left side faces of the nanosheets 21b, 23a, 23c, 24b, 25, 26a, and 26c are exposed, not covered with the gate interconnects 31b, 33a, 33b, 34b, 35, 36a, and 36b, respectively. The right side faces of the nanosheets 21a, 21c, 22, 23b, 24a, 24c, and 26b are exposed, not covered with the gate interconnects 31a, 31b, 32, 33a, 34a, 34b, and 36a, respectively.

That is, the faces of the nanosheets 21a and 21b opposed to each other in the X direction are exposed from the gate interconnects 31a and 31b, respectively. The faces of the nanosheets 22 and 23a opposed to each other in the X direction are exposed from the gate interconnects 32 and 33a, respectively. The faces of the nanosheets 23b and 23c opposed to each other in the X direction are exposed from the gate interconnects 33a and 33b, respectively. The faces of the nanosheets 24a and 24b opposed to each other in the X direction are exposed from the gate interconnects 34a and 34b, respectively. The faces of the nanosheets 24c and 25 opposed to each other in the X direction are exposed from the gate interconnects 34b and 35, respectively. The faces of the nanosheets 26b and 26c opposed to each other in the X direction are exposed from the gate interconnects 36a and 336b, respectively.

Also, the right side faces of the nanosheets 21b, 23a, 23c, 24b, 25, 26a, and 26c are not exposed but covered with the gate interconnects 31b, 33a, 33b, 34b, 35, 36a, and 36b, respectively. The left side faces of the nanosheets 21a, 21c, 22, 23b, 24a, 24c, and 26b are not exposed but covered with the gate interconnects 31a, 31b, 32, 33a, 34a, 34b, and 36a, respectively.

That is, the faces of the nanosheets 21b and 21c opposed to each other in the X direction are not exposed from the gate interconnect 31b. The faces of the nanosheets 23a and 23b opposed to each other in the X direction are not exposed from the gate interconnect 33a. The faces of the nanosheets 24b and 24c opposed to each other in the X direction are not exposed from the gate interconnect 34b. The faces of the nanosheets 26a and 26b opposed to each other in the X direction are not exposed from the gate interconnect 36a.

Also, the nanosheets 22 are formed at the upper right of the nanosheets 25 in the figure. That is, the faces of the nanosheets 22 and 25 opposed to each other in the X direction are not exposed from the gate interconnects 32 and 35, respectively.

The nanosheets 21a and 24a are formed close to the cell boundary on the left side in the figure, and the nanosheets 23c and 26c are formed close to the cell boundary on the right side in the figure. One-port SRAM cells inverted in the X direction are placed on the left and right sides of the one-port SRAM cell of FIGS. 10A-10B. That is, in one-port SRAM cells placed side by side in the X direction, the faces of the nanosheets 21a opposed to each other in the X direction are not exposed from the gate interconnects 31a. The faces of the nanosheets 23c opposed to each other in the X direction are not exposed from the gate interconnects 33b. The faces of the nanosheets 24a opposed to each other in the X direction are not exposed from the gate interconnects 34a. The faces of the nanosheets 26c opposed to each other in the X direction are not exposed from the gate interconnects 36b.

In FIGS. 10A-10B, the power line 11 is formed between the nanosheets 22 and 25 as viewed in plan. The power line 12 is formed between the nanosheets 21b and 21c and between the nanosheets 24b and 24c. The power line 13 is formed between the nanosheets 23a and 23b and between the nanosheets 26a and 26b. The power line 15 is formed along the cell boundary on the left side in the figure as viewed in plan. The power line 16 is formed along the cell boundary on the right side in the figure as viewed in plan.

Having the above configuration, the faces of the nanosheets 21a and 21b opposed to each other in the X direction are exposed from the gate interconnects 31a and 31b, the faces of the nanosheets 23b and 23c opposed to each other in the X direction are exposed from the gate interconnects 33a and 33b, the faces of the nanosheets 24a and 24b opposed to each other in the X direction are exposed from the gate interconnects 34a and 34b, and the faces of the nanosheets 26b and 26c opposed to each other in the X direction are exposed from the gate interconnects 36a and 36b. This can reduce the distance d1 between the transistors PG21 and PG22, between the transistors PD12 and PD13, between the transistors PD21 and PD22, and between the transistors PG12 and PG13 in the X direction, and thus achieve reduction in the area of the semiconductor storage device.

Also, with the power line 11 supplying VDD and the power lines 12, 13, 15, and 16 supplying VSS formed in the buried interconnect layer, it is possible to reduce the width of the interconnect 71 supplying VDD in the X direction and the width of the interconnects 72 and 73 supplying VSS in the X direction in the M1 interconnect layer. As a result, the width of the interconnects 75 and 74 to serve as the bit lines BL and BLB in the X direction can be increased. It is therefore possible to achieve speedup and improved write characteristics of the semiconductor storage device.

The power lines 15 and 16 are formed along the cell boundaries on the left and right sides, respectively, in the figure as viewed in plan. In one-port SRAM cells placed side by side in the X direction, the faces of the nanosheets 21a opposed to each other in the X direction are not exposed from the gate interconnects 31a, the faces of the nanosheets 23c opposed to each other in the X direction are not exposed from the gate interconnects 33b, the faces of the nanosheets 24a opposed to each other in the X direction are not exposed from the gate interconnects 34a, and the faces of the nanosheets 26c opposed to each other in the X direction are not exposed from the gate interconnects 36b. The power line 15 is therefore formed between the transistors PG21 and between the transistors PD21, the distance between which is larger than the distance d1 in the X direction, as viewed in plan. The power line 16 is formed between the transistors PD13 and between the transistors PG13, the distance between which is larger than the distance d1 in the X direction, as viewed in plan. That is, the power line 15 can be easily formed without the necessity of widening the spacing between the transistors PG21 and the spacing between the transistors PD21. The power line 16 can be easily formed without the necessity of widening the spacing between the transistors PD13 and the spacing between the transistors PG13. This can prevent increase in the area of the semiconductor storage device.

Therefore, in the semiconductor storage device including a one-port SRAM cell using forksheet transistors, it is possible to achieve speedup and improved write characteristics while preventing area increase.

Note that some of the power lines 11 to 13, 15, and 16 may be omitted: at least one power line will suffice.

Alteration 1

FIGS. 11A-11B are plan views showing another example of the layout structure of the one-port SRAM cell according to the third embodiment. Specifically, FIG. 11A shows an upper part of the cell, and FIG. 11B shows a lower part of the cell. In FIGS. 11A-11B, the faces of the nanosheets on the side opposite to the side in the case of FIGS. 10A-10B in the X direction are exposed from the gate interconnects. Also, the positions of the power lines formed in the buried interconnect layer are different.

The power lines 11 to 14 are formed in the buried interconnect layer. The power lines 11 and 14 supply VDD, and the power lines 12 and 13 supply VSS.

As shown in FIG. 11B, the gate interconnects 31a, 31b, 32, 33a, 33b, 34a, 34b, 35, 36a, and 36b are formed. The gate interconnect 31a overlaps the nanosheets 21a and 21b as viewed in plan, the gate interconnect 31*b* overlaps the nanosheets 21*c* as viewed in plan, the gate interconnect 33*a* overlaps the nanosheets 22 and 23*a* as viewed in plan, the gate interconnect 33*b* overlaps the nanosheets 23*b* and 23*c* as viewed in plan, the gate interconnect 34*a* overlaps the nanosheets 24*a* and 24*b* as viewed in plan, the gate interconnect 34*b* overlaps the nanosheets 24*c* and 25 as viewed in plan, the gate interconnect 36*a* overlaps the nanosheets 26*a* as viewed in plan, and the gate interconnect 36*b* overlaps the nanosheets 26*b* and 26*c* as viewed in plan.

In FIGS. 11A-11B, the gate interconnect 31*a* is to be the gates of the transistors PG21 and PG22, the gate interconnect 31*b* is to be the gate of the transistor PG23, the gate interconnect 33*a* is to be the gates of the load transistor PU1 and the transistor PD11, the gate interconnect 33*b* is to be the gates of the transistors PD12 and PD13, the gate interconnect 34*a* is to be the gates of the transistors PD21 and PD22, the gate interconnect 34*b* is to be the gates of the transistor PD23 and the load transistor PU2, the gate interconnect 36*a* is to be the gate of the transistor PG11, and the gate interconnect 36*b* is to be the gates of the transistors PG12 and PG13.

The gate interconnect 31*a* is connected with a gate interconnect 31*a* of a one-port SRAM cell placed on the left side of the subject one-port SRAM cell in the figure through the bridge 133. The gate interconnects 31*a* and 31*b* are mutually connected through the bridge 135. The gate interconnects 32 and 33*a* are mutually connected through the bridge 131. The gate interconnects 33*a* and 33*b* are mutually connected through the bridge 136. The gate interconnects 34*a* and 34*b* are mutually connected through the bridge 137. The gate interconnects 34*b* and 35 are mutually connected through the bridge 132. The gate interconnects 36*a* and 36*b* are mutually connected through the bridge 138. The gate interconnect 36*b* is connected with a gate interconnect 36*b* of a one-port SRAM cell placed on the right side of the subject one-port SRAM cell in the figure through the bridge 134.

The interconnect 76 is connected with the gate interconnect 31*a* through the contact 87 and the bridge 133. The interconnect 77 is connected with the gate interconnect 36*b* through the contact 88 and the bridge 134.

In FIGS. 11A-11B, the right side faces of the nanosheets 21*b*, 23*a*, 23*c*, 24*b*, 25, 26*a*, and 26*c* are exposed, not covered with the gate interconnects 31*a*, 33*a*, 33*b*, 34*a*, 34*b*, 36*a*, and 36*b*, respectively. The left side faces of the nanosheets 21*a*, 21*c*, 22, 23*b*, 24*a*, 24*c*, and 26*b* are exposed, not covered with the gate interconnects 31*a*, 31*b*, 33*a*, 33*b*, 34*a*, 34*b*, and 36*b*, respectively.

That is, the faces of the nanosheets 21*b* and 21*c* opposed to each other in the X direction are exposed from the gate interconnects 31*a* and 31*b*, respectively. The faces of the nanosheets 23*a* and 23*b* opposed to each other in the X direction are exposed from the gate interconnects 33*a* and 33*b*, respectively. The faces of the nanosheets 24*b* and 24*c* opposed to each other in the X direction are exposed from the gate interconnects 34*a* and 34*b*, respectively. The faces of the nanosheets 26*a* and 26*b* opposed to each other in the X direction are exposed from the gate interconnects 36*a* and 36*b*, respectively.

Also, the nanosheets 22 are formed at the upper right of the nanosheets 25 in the figure. That is, the faces of the nanosheets 22 and 25 opposed to each other in the X direction are exposed from the gate interconnects 33*a* and 34*b*, respectively.

The nanosheets 21*a* and 24*a* are formed close to the cell boundary on the left side in the figure, and the nanosheets 23*c* and 26*c* are formed close to the cell boundary on the right side in the figure. One-port SRAM cells inverted in the X direction are placed on the left and right sides of the one-port SRAM cell of FIGS. 11A-11B. That is, in one-port SRAM cells placed side by side in the X direction, the faces of the nanosheets 21*a* opposed to each other in the X direction are exposed from the gate interconnects 31*a*. The faces of the nanosheets 23*c* opposed to each other in the X direction are exposed from the gate interconnects 33*b*. The faces of the nanosheets 24*a* opposed to each other in the X direction are exposed from the gate interconnects 34*a*. The faces of the nanosheets 26*c* opposed to each other in the X direction are exposed from the gate interconnects 36*b*.

Also, the left side faces of the nanosheets 21*b*, 23*a*, 23*c*, 24*b*, 25, 26*a*, and 26*c* are not exposed but covered with the gate interconnects 31*a*, 33*a*, 33*b*, 34*a*, 34*b*, 36*a*, and 36*b*, respectively. The right side faces of the nanosheets 21*a*, 21*c*, 22, 23*b*, 24*a*, 24*c*, and 26*b* are not exposed but covered with the gate interconnects 31*a*, 31*b*, 33*a*, 33*b*, 34*a*, 34*b*, and 36*b*, respectively.

That is, the faces of the nanosheets 21*a* and 21*b* opposed to each other in the X direction are not exposed from the gate interconnect 31*a*. The faces of the nanosheets 22 and 23*a* opposed to each other in the X direction are not exposed from the gate interconnect 33*a*. The faces of the nanosheets 23*b* and 23*c* opposed to each other in the X direction are not exposed from the gate interconnect 33*b*. The faces of the nanosheets 24*a* and 24*b* opposed to each other in the X direction are not exposed from the gate interconnect 34*a*. The faces of the nanosheets 24*c* and 25 opposed to each other in the X direction are not exposed from the gate interconnect 34*b*. The faces of the nanosheets 26*b* and 26*c* opposed to each other in the X direction are not exposed from the gate interconnect 36*b*.

In FIGS. 11A-11B, the power line 12 is formed between the nanosheets 21*a* and 21*b* and between the nanosheets 24*a* and 24*b* as viewed in plan. The power line 11 is formed between the nanosheets 24*c* and 25 as viewed in plan. The power line 14 is formed between the nanosheets 22 and 23*a* as viewed in plan. The power line 13 is formed between the nanosheets 23*b* and 23*c* and between the nanosheets 26*b* and 26*c* as viewed in plan.

According to the layout structure of FIGS. 11A-11B, in one-port SRAM cells placed side by side in the X direction, the faces of the nanosheets 21*a* opposed to each other in the X direction are exposed from the gate interconnects 31*a*, the faces of the nanosheets 23*c* opposed to each other in the X direction are exposed from the gate interconnects 33*b*, the faces of the nanosheets 24*a* opposed to each other in the X direction are exposed from the gate interconnects 34*a*, and the faces of the nanosheets 26*c* opposed to each other in the X direction are exposed from the gate interconnects 36*b*. It is therefore possible to reduce the distance d1 between the transistors PG21 in the X direction, between the transistors PD13 in the X direction, between the transistors PD21 in the X direction, and between the transistors PG13 in the X direction, and thus achieve reduction in the area of the semiconductor storage device.

Also, the power lines 12 and 13 supplying VSS are formed in the buried interconnect layer. The power line 12 is formed between the nanosheets 21*a* and 21*b* and between the nanosheets 24*a* and 24*b*, and the power line 13 is formed between the nanosheets 23*b* and 23*c* and between the nanosheets 26*b* and 26*c*, as viewed in plan. The faces of the nanosheets 21*a* and 21*b* opposed to each other in the X direction are not exposed from the gate interconnect 31*a*, the faces of the nanosheets 22 and 23*a* opposed to each other in the X direction are not exposed from the gate interconnect 33a, the faces of the nanosheets 23b and 23c opposed to each other in the X direction are not exposed from the gate interconnect 33b, the faces of the nanosheets 24a and 24b opposed to each other in the X direction are not exposed from the gate interconnect 34a, the faces of the nanosheets 24c and 25 opposed to each other in the X direction are not exposed from the gate interconnect 34b, and the faces of the nanosheets 26b and 26c opposed to each other in the X direction are not exposed from the gate interconnect 36b. The power line 12 is therefore formed between the transistors PG21 and PG22 and between the transistors PD21 and PD22, the distance between which is larger than the distance d1 in the X direction. The power line 13 is formed between the transistors PD12 and PD13 and between the transistors PG12 and PG13, the distance between which is larger than the distance d1 in the X direction. That is, the power line 12 can be easily formed without the necessity of widening the spacing between the transistors PG21 and PG22 and between the transistors PD21 and PD22 in the X direction. The power line 13 can be easily formed without the necessity of widening the spacing between the transistors PD12 and PD13 and between the transistors PG12 and PG13 in the X direction. This makes it possible to achieve speedup of the semiconductor storage device while preventing increase in the area of the semiconductor storage device.

In addition, similar effects to those obtained in the configuration of FIGS. 10A-10B can be obtained.

Alteration 2

Figure 12A:
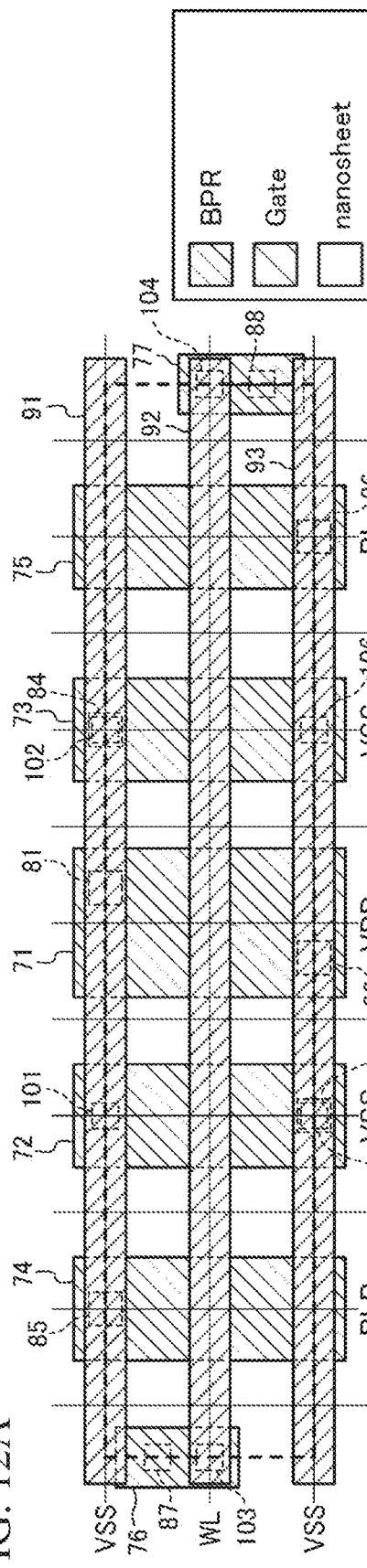
FIGS. 12A-12B are plan views showing yet another example of the layout structure of the one-port SRAM cell according to the third embodiment.
Figure 12B:
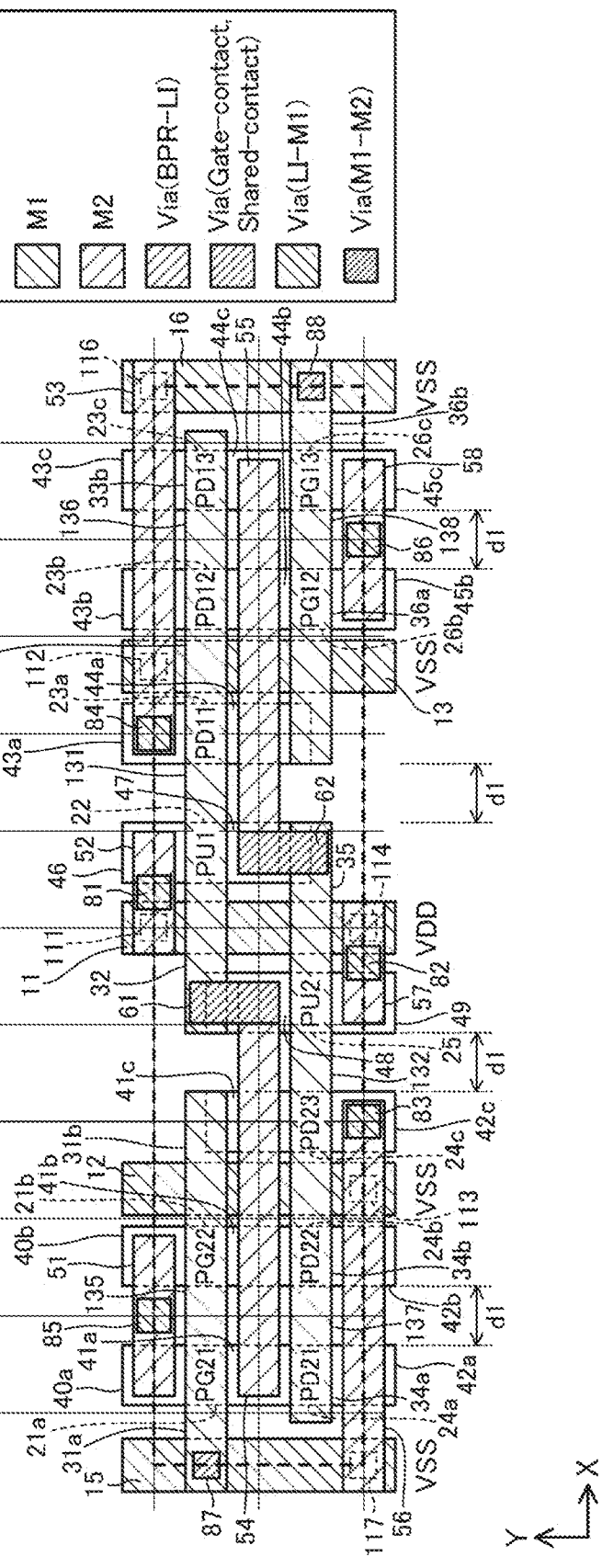

FIGS. 12A-12B are plan views showing yet another example of the layout structure of the one-port SRAM cell according to the third embodiment. Specifically, FIG. 12A shows an upper part of the cell, and FIG. 12B shows a lower part of the cell. In FIGS. 12A-12B, in comparison with FIGS. 10A-10B, the access transistors PG1 and PG2 are each constituted by two transistors.

In FIGS. 12A-12B, the nanosheets 21c and 26a and the pads 40c and 45a in FIGS. 10A-10B are omitted. That is, the access transistor PG2 is constituted by the transistors PG21 and PG22, and the access transistor PG1 is constituted by the transistors PG12 and PG13.

With the layout structure of FIGS. 12A-12B, similar effects to those obtained in the configuration of FIGS. 10A-10B can be obtained.

Alteration 3

FIGS. 13A-13B are plan views showing yet another example of the layout structure of the one-port SRAM cell according to the third embodiment. Specifically, FIG. 13A shows an upper part of the cell, and FIG. 13B shows a lower part of the cell. In FIGS. 13A-13B, in comparison with FIGS. 11A-11B, the access transistors PG1 and PG2 are each constituted by two transistors. Also, the gate interconnects 31a and 31b are not mutually connected, and the gate interconnects 36a and 36b are not mutually connected.

In FIGS. 13A-13B, the nanosheets 21c and 26a and the pads 40c and 45a in FIGS. 11A-11B are omitted. That is, the access transistor PG2 is constituted by the transistors PG21 and PG22, and the access transistor PG1 is constituted by the transistors PG12 and PG13. Also, the bridges 135 and 138 in FIGS. 11A-11B are omitted. That is, the gate interconnects 31a and 31b are not mutually connected, and the gate interconnects 36a and 36b are not mutually connected.

According to the layout structure of FIGS. 13A-13B, since the gate interconnects 31a and 31b are not connected and the gate interconnects 36a and 36b are not connected, the gate interconnects 31b and 36a having no function as part of a transistor can be cut off from the circuit constituted in the one-port SRAM cell. It is therefore possible to reduce the load capacitance of the word line.

In addition, similar effects to those obtained in the layout structure of FIGS. 11A-11B can be obtained.

In the embodiments and alterations described above, while each transistor includes three nanosheets, some or all transistors may include one nanosheet, two nanosheets, or four or more nanosheets.

While the cross-sectional shape of the nanosheets is illustrated as rectangular in the above embodiments, it is not limited to this. For example, the shape may be square, circular, or oval.

According to the present disclosure, in the layout structure of a one-port SRAM cell using forksheet transistors, it is possible to achieve speedup and improved write characteristics of a semiconductor storage device while preventing increase in the area of the semiconductor storage device.

What is claimed is:

1. A semiconductor storage device including a one-port SRAM cell, the one-port SRAM cell comprising:
   a first transistor connected to a first power supply supplying a first voltage at one of its nodes, to a first node at the other node, and to a second node at its gate;
   a second transistor connected to the first power supply at one of its nodes, to the second node at the other node, and to the first node at its gate;
   a third transistor connected to the first node at one of its nodes, to a second power supply supplying a second voltage different from the first voltage at the other node, and to the second node at its gate;
   a fourth transistor connected to the second node at one of its nodes, to the second power supply at the other node, and to the first node at its gate;
   a fifth transistor connected to a first bit line at one of its nodes, to the first node at the other node, and to a word line at its gate; and
   a sixth transistor connected to a second bit line at one of its nodes, to the second node at the other node, and to the word line at its gate, the first bit line and the second bit line constituting a complementary bit line pair,
   wherein
   the first to sixth transistors respectively include
      first to sixth nanosheets extending in a first direction, and
      first to sixth gate interconnects surrounding the first to sixth nanosheets, respectively, in a second direction vertical to the first direction and in a third direction perpendicular to the first and second directions,
   the sixth, first, and third nanosheets are formed in line in this order in the second direction,
   the fourth, second, and fifth nanosheets are formed in line in this order in the second direction,
   faces of the fourth and sixth nanosheets on a first side that is close to a cell boundary in the second direction are exposed from the fourth and sixth gate interconnects,
   faces of the third and fifth nanosheets on a second side that is opposite to the first side in the second direction are exposed from the third and fifth gate interconnects,
   a face of the second nanosheet on the second side is exposed from the second gate interconnect, and
   a face of the first nanosheet on the first side is exposed from the first gate interconnect.

2. The semiconductor storage device of claim 1, wherein the one-port SRAM cell further comprises:
a first interconnect extending in the first direction, which is to be the first bit line; and
a second interconnect extending in the first direction, which is to be the second bit line,
the first and second interconnects are formed in a same first interconnect layer above the first to sixth transistors, and
at least one of the first and second interconnects is larger in width in the second direction than an interconnect, among interconnects formed in the first interconnect layer, of which the width in the second direction is smallest.

3. The semiconductor storage device of claim 1, wherein the one-port SRAM cell further comprises:
a third interconnect extending in the second direction, which is to be the word line,
the third interconnect is formed in a second interconnect layer above the first to sixth transistors.

4. The semiconductor storage device of claim 1, wherein a first power line supplying the first voltage is formed to extend in the first direction in a layer below the first to sixth transistors.

5. The semiconductor storage device of claim 1, wherein the one-port SRAM cell further comprises:
a second and third power lines supplying the second voltage, extending in the first direction in a layer below the first to sixth transistors.

6. The semiconductor storage device of claim 1, wherein the one-port SRAM cell comprises a local interconnect extending in the second direction, connected to any of the nodes of the first to sixth transistors, and
an end of the local interconnect in the second direction is located somewhere between both ends of the connected node.

* * * * *